(12) United States Patent
Ushifusa et al.

(10) Patent No.: US 7,045,944 B2
(45) Date of Patent: May 16, 2006

(54) IMAGE DISPLAY APPARATUS WITH ULTRAVIOLET RAY SHIELD RESIN FILM AND PROCESS FOR ITS PRODUCTION

(75) Inventors: Nobuyuki Ushifusa, Yokohama (JP); Nobuhiko Fukuoka, Ebina (JP); Hiroshi Kikuchi, Zushi (JP); Hiroyasu Matsuura, Yokohama (JP); Issei Takemoto, Hiratsuka (JP)

(73) Assignee: Hitachi Displays, Ltd., Mobara (JP)

( * ) Notice: Subject to any disclaimer, the term of this patent is extended or adjusted under 35 U.S.C. 154(b) by 264 days.

(21) Appl. No.: 10/624,482

(22) Filed: Jul. 23, 2003

(65) Prior Publication Data

US 2004/0095060 A1    May 20, 2004

(30) Foreign Application Priority Data

Aug. 26, 2002    (JP) .............................. 2002-244880

(51) Int. Cl.
*H01J 61/35*    (2006.01)
(52) U.S. Cl. ...................................... 313/489

(58) Field of Classification Search ................. 313/489; 445/23–25
See application file for complete search history.

(56) References Cited

FOREIGN PATENT DOCUMENTS

JP    11-176571    7/1999

*Primary Examiner*—Joseph Williams
(74) *Attorney, Agent, or Firm*—Antonelli, Terry, Stout and Kraus, LLP.

(57) ABSTRACT

Disclosed is an image display apparatus having a construction such that ultraviolet rays irradiated from a second substrate side are prevented from propagating through a first substrate to reach its display area by providing a picture-frame resin film for shielding ultraviolet rays on that area of the first substrate that is to be sealed to the second substrate with a sealant. Thereby, when the sealant for sealing the substrates is cured by irradiation of ultraviolet rays, photo deterioration of organic materials constituting emitting layered products and semiconductor layers constituting active elements both of which are formed on the display area may be prevented, and a high-reliability and high-performance image display apparatus may be realized.

15 Claims, 16 Drawing Sheets

(a)

(b)

IMAGE DISPLAY APPARATUS WITH ULTRAVIOLET RAY SHIELD RESIN FILM AND PROCESS FOR ITS PRODUCTION

BACKGROUND OF THE INVENTION

This invention relates to an image display apparatus, and more specifically to, an image display apparatus using a display panel such that a display area is formed between a pair of substrates, and process for its production.

The so-called panel-type image display apparatus with characteristics of being a thin shape, lightweight, and/or low consumption power is widely adopted for a personal computer, mobile information equipment, such as a cellular phone, or a monitor of a television receiver. For this kind of image display apparatus, one using a liquid crystal display panel, one using an organic electroluminescent panel (hereinafter referred to as the "organic EL panel"), one using a plasma display panel, and one using a field emission display panel, etc. are known.

The panel-type image display apparatus comprises normally the display area in which a large number of pixels each composed of a semiconductor layer constituting an active element and a fluorescent layer or an emitting layer are arranged in a matrix form between a pair of substrates at least one of which has light transmissivity, such as a glass, and is constructed by sealing a surrounding area outside this display area (hereinafter referred to as the "outer area" for simplicity) to be airtight using a sealing adhesive. Sealing of the substrates is done by putting a sealing adhesive, such as an epoxy adhesive, between the outer area of the display area on one of a pair of substrates and a corresponding area of the other substrate, and curing it by irradiation of ultraviolet rays or thermal processing. In this curing process by irradiation of ultraviolet rays, if the ultraviolet rays irradiate constituent members such as a semiconductor layer and an organic emitting layer formed in the pixel area, physical properties (or being called characteristics) of the constituent members of the semiconductor layer, the emitting layer, etc. may deteriorate. In the following, taking an image display apparatus using the organic EL panel as an example, effects by the irradiation of ultraviolet rays will be described.

The image display apparatus using the organic EL panel is produced by performing sequentially at least the following processes of: patterning an anode electrode formed on the light-transmitting first substrate, which is preferably a glass plate, for each pixel; forming banks for separating the later-described layered product formed on the anode electrodes for each element; forming a hole-injection layer for injecting electron holes from the anode electrode in each space separated by the banks; forming a hole-transport layer for transporting electron holes to the emitting layer; forming selectively the emitting layer composed of an organic layer for emitting one of red, green, and blue lights for each element of an emitting layered product; forming an electron-transport layer for transporting electrons from a cathode electrode; forming the cathode electrode for supplying electrons; and bonding the second substrate constituting a cap to the first substrate so as to be airtight with a sealant in order to block out the layered products from the outside.

Sealant is cured normally by irradiating ultraviolet rays from the substrate side on a sealing area on which the sealant is applied. Incidentally, there is a case where the substrate further undergoes thereafter a process of promoting the curing by thermal processing. In the image display apparatus using such an organic EL panel, in addition to deterioration of characteristics of the semiconductor layers, the emitting layer, etc. described above caused by irradiation of ultraviolet rays on the display area encircled by the sealing area, as disclosed in JP-A No. 176571/1999, peel is caused between the emitting layers and electrode layers, the constituent materials in the pixel area vary in characteristics due to effects of the outside air and moisture that have invaded the interior through the sealing part even if the airtight sealing has been done with the cap. Especially when the characteristics of the emitting layers deteriorated, non-emitting regions called dark spots or other defects occur in the display screen, and light emission of predetermined quality cannot be maintained as driving time accumulates.

Since the constituent materials are prone to be affected by the outside air and moisture as described above, it is a problem in the image display apparatus how the atmosphere at the time of sealing the two substrates may be controlled and how a state just after the sealing may be maintained. Moreover, since in the organic EL panel, its emitting layers are of organic materials, there is a possibility that gases might be generated after the sealing. Because of this, the substrates are sealed with an adsorbent capable of adsorbing the outside air and moisture that have invaded the interior of the panel passing through the sealant as well as generated gases. It is common that in order that this adsorbent does not interfere the emitting layered product composed of an emitting layer, the electrodes, etc., the second substrate constituting the cap is given the shape of a hollow that is fallen to its periphery or is provided with a rib formed on the periphery, and the adsorbent is disposed in the hollow area.

As a method for making the inner side of the second substrate constituting the cap hollow, there are a method for caving the inner side of a glass plate or a quartz plate by machining, sandblasting, or chemical etching and a method for integral molding the second substrate with a metal plate and a glass plate by means of a press etc. In the case where a metal plate is adopted for the cap, it is necessary to cure the sealant by irradiating ultraviolet rays from the side of the first substrate on which the emitting layer is formed. In the case where a glass plate is adopted for the cap, it is possible to cure the sealant by irradiating ultraviolet rays not only from the side of the substrate on which the emitting layer is formed but also from the side of the second substrate constituting the cap.

However, in the case where ultraviolet rays are irradiated from the side of the first substrate on which the emitting layer is formed, if an outlet part of electric terminals (external terminals) is made of a metal material, the ultraviolet rays are shielded by this external terminal, and hence it is impossible to cure the sealant sufficiently. Therefore, it is a certain method that the cap is made from the second substrate of a light-transmitting material such as a glass plate and the sealant is cured by irradiation of ultraviolet rays from this second substrate side. However, in either case, due to irradiation of ultraviolet rays in a curing process of the sealant, the ultraviolet rays are scattered in the first substrate on which the emitting layer is formed, or propagate through the first substrate as far as the display area to irradiate a display element (emitting layered product) made up of the emitting layer, and consequently an organic material thereof deteriorates and an emission life falls off. Thus, it is one of the problems that when the sealant is cured by ultraviolet rays, the emitting layered product made of the organic material is protected from the ultraviolet rays.

The image display apparatus using the organic EL panel is obtained by superposing the cap on the first substrate, which is preferably of a glass, on which the emitting layer is formed and sealing these members with a sealant, and thereby the emitting layered product comprising the organic material is shut off from the external atmosphere with the sealant. In the sealing process, the sealing is conducted in a space enclosed from the outside in order to enable the work to be done in an atmosphere where active gases and moisture are excluded as much as possible. However, as described above, after the sealing, the emitting layered product comprising the organic material may deteriorate in its emission properties (also called emission physical properties) because of moisture and gases of oxygen etc. that have invaded from the outside though the sealant to effect shortened emission life. Therefore, it is one of the problems that the first substrate on which the emitting layers are formed is aligned correctly to the second substrate constituting the cap and airtight sealing of these members is performed with the sealant surely. Such problems accompanying the irradiation of ultraviolet rays is not restricted to the image display apparatus using the organic EL panel, and similarly exist in various panel-type image display apparatuses, such as a liquid crystal display, a plasma electrical discharge display, and a field emission display.

SUMMARY OF THE INVENTION

It is the object of this invention to solve the problems described above and provide a high-reliability image display apparatus by protecting constituent members in the pixel area from ultraviolet rays being irradiated at the time of sealing the substrates, curing the sealant surely, and realizing sealing of enhanced airtightness.

To attain the object, this invention provides a novel construction that prevents ultraviolet rays from irradiating or reaching the display area encircled by the sealing areas of the first substrate when the first substrate and the second substrate are aligned to each other and the sealant applied on the sealing areas on the peripheries of the two substrates is cured by irradiating ultraviolet rays and a process for its production that will be described below.

FIG. 1 is a substantial-part cross sectional view for schematically explaining a basic panel construction of the image display apparatus according to this invention. In the figure, reference numeral 100 denotes a first substrate, reference numeral 200 denotes a second substrate, and a pixel area 101 containing active elements is formed on the inner side of the first substrate. Reference symbol AR denotes the display area made up of the pixel area 101. Sealant 220 is applied on the peripheries of the first substrate 100 and of the second substrate 200 facing each other and allows the two substrates to be sealed. Moreover, the first substrate 100 has an ultraviolet-ray shield resin film 300 for shielding ultraviolet rays between itself and the sealant 220. Incidentally, regarding implementation of a drive circuit for driving the pixels, there are a method in which the drive circuit is disposed inside the geometry of the sealant on the first substrate 100 (on the display area AR side), a method in which it is disposed outside the geometry of the sealant on the first substrate 100, and the like. Here, illustration thereof is omitted.

The sealant 220 is cured by irradiating ultraviolet rays from the second substrate 200 side. Forming the ultraviolet-ray shield resin film 300 prevents ultraviolet rays UV for curing the sealant 220 from entering the first substrate 100, so that the ultraviolet rays will not be scattered at the first substrate 100, and nor propagate through the first substrate 100 to reach the display area AR. Therefore, even when ultraviolet rays are irradiated, both constituent members of the pixel area 101 and the semiconductor layers of the active elements provided in the display area are controlled so as not to be deteriorated by the ultraviolet rays. This ultraviolet-ray shield resin film 300 may be formed by application of a resin resist in which particles of a light-absorbing material are mixed. Alternatively, if wiring etc. of the external terminals and the like is formed on the first substrate 100, a black metallic light-shield film that is insulated by an insulating layer may be used.

FIG. 2 is a substantial-part cross sectional view for schematically explaining another basic panel construction of the image display apparatus according to this invention. FIG. 2 shows the construction where an ultraviolet-light shield resin film 301 is formed so as not to exist on the application part of the sealant on the second substrate 200, which is a modification of the construction of FIG. 1. In this modification, the ultraviolet-ray shield resin film 300 formed on the first substrate 100 is the same as that shown in FIG. 1, and the ultraviolet-ray shield resin film 301 on the second substrate 200 may be a black metallic light-shield film. At this time, in the case where the wiring etc. of the external terminals and the like of the second substrate 200 is formed, if the metallic light-shield film is intended to be provided, all that is necessary is to interpose an appropriate insulating layer between the two members.

This construction prevents the ultraviolet rays UV from entering the first substrate 100, resulting in that the ultraviolet rays will not be scattered by the first substrate 100, and nor propagate through the first substrate 100 to reach the display area. Therefore, even when ultraviolet rays are irradiated, both constituent members of the pixel area 101 and the semiconductor layers of the active elements provided in the display area are controlled so as not to be deteriorated by ultraviolet rays. Other constituent members and effects are the same as those shown in FIG. 1.

As described above, the image display apparatus according to this invention has the light-transmitting first substrate 100 having a display area on which a large number of pixels each having an active element are arranged in a matrix form. The image display apparatus also has a light-transmitting second substrate 200 that is to be sealed to the first substrate 100 with the sealant 220 interposed on a sealing area in the shape of a picture frame (hereinafter referred to as the "picture-frame sealing area" for simplicity) located in the outer area of the display area facing the first substrate 100. And the image display apparatus also has the ultraviolet-ray shield resin film 300 for shielding ultraviolet rays provided on the sealing area between the first substrate 100 and the sealant 220. Alternatively, the ultraviolet-ray shield resin film 301 may also be provided on that portion of the second substrate 200 where the sealant 220 does not exist. In the case where the inner side of the second substrate 200 does not have constituent members of the pixels and the first substrate 100 side serves as an observation side and other cases, this ultraviolet-ray shield resin film 301 may be formed on the entire area inside the geometry of the sealant 220 on the second substrate 200. Moreover, a metallic light-shield film may be formed instead of the ultraviolet-ray shield resin film 301.

Especially when applying this invention to the image display apparatus using the organic EL panel, in the image display apparatus using the organic EL panel comprising:
  (a) a light-transmitting first substrate, which is preferably a glass plate, on which a plurality of pixels each composed of the anode electrode that is driven by the active element, the emitting layered product such that an organic layer having at least the emitting layer is formed on an area encircled by the pixel separation banks formed on the anode electrodes, and the cathode electrode that sandwiches the emitting layered product between itself and the anode electrode, are arranged in predetermined locations in a matrix form; and (b) a light-transmitting second substrate, which is preferably a glass plate, that is sealed to the first substrate by interposing a sealant on the picture-frame sealing area located in the outer area of the display area, wherein the image display apparatus has an ultraviolet-ray shield resin film for shielding ultraviolet rays is provided in the sealing area between the first substrate and the sealant. Moreover, the ultraviolet-ray shield resin film maybe provided in a portion excluding a sealant interposing portion of the second substrate that corresponds to the picture-frame sealing area of the first substrate Still further, it is desirable that the ultraviolet-ray shield resin film formed on the first substrate in the image display apparatus using the organic EL panel is formed with a material having the same properties as the pixel separation banks, and a cross section of the ultraviolet-ray shield resin film vertical to the first substrate in a direction intersecting an extension direction of the picture frame has a recess composed of an inner peripheral protrusion protruding on the display area side and an outer peripheral protrusion protruding on a side opposite to the display area side, and the film thicknesses of the inner peripheral protrusion and of the outer peripheral protrusion are made thicker than the film thickness of the pixel separation banks. A metallic light-shield film for shielding ultraviolet rays may be provided between this ultraviolet-ray shield resin film and the first substrate.

As a process for producing the image display apparatus using the organic EL panel, it is preferable to adopt a process having the following processing steps. That is, the process comprises at least: a pixel area formation step of forming a large number of active elements arranged in a matrix form in the pixel area of the light-transmitting first substrate and electrodes/wiring including anode electrodes driven by the respective active elements and external terminals; a separation banks/ultraviolet-ray shield resin film formation step of simultaneously forming pixel separation banks for separating the anode electrodes and an ultraviolet-ray shield resin film that is in the shape of a picture frame along the outer area of the display area of the first substrate and has a recess constructed by the inner peripheral protrusion and the outer peripheral protrusion formed in the central portion of the picture frame; an organic emitting layer formation step of forming the organic emitting layers on anode electrodes that are separated by the pixel separation banks; a cathode formation step of forming a cathode electrode that covers the organic emitting layers; an adsorbent bed formation step of forming an adsorbent bed for adsorbing gases and moisture in an area on the light-transmitting second substrate encircled by the protruding rib running around in the shape of a picture frame on the periphery of the second substrate that corresponds to the ultraviolet-ray shield resin film of the first substrate; a sealant application step of applying a sealant on the recess of the ultraviolet-ray shield resin film of the first substrate; and a substrate bonding step of making the rib of the second substrate engage with the recess of the first substrate and sealing the two members with the sealant.

Alternatively, a metallic light-shield film formation process of forming a metallic light-shield film for shielding ultraviolet rays on the external terminals located in positions where the ultraviolet-ray shield resin film is formed with an intermediary of an insulating film may be introduced before the separation banks/ultraviolet-ray shield resin film formation process. Further, as the separation banks/ultraviolet-ray shield resin film formation process, a printing method that uses screen masks each having apertures that correspond to either of the pixel separation banks or the ultraviolet-ray shield resin film may be adopted.

Thus, in this invention, the light-transmitting first substrate on which the emitting layered products are formed and the second substrate that has equivalent light transmitting properties as those of the first substrate and such that at least the sealing area to be sealed with the sealant is transparent (or the second substrate constituting the cap) are used, and the ultraviolet-ray shield resin film for shielding ultraviolet rays (or the ultraviolet-ray shield resin film and the metallic light-shield film) in the shape of a picture frame is provided on the periphery that corresponds to the sealing area at which the light-transmitting substrate is sealed with the sealant, whereby when the sealant is cured by irradiation of ultraviolet rays, constituent members, such as the semiconductor layer and the emitting layered product composed of the organic materials existing in the display region, may be protected from the ultraviolet rays.

Still further, especially in the image display apparatus using the organic EL panel, by arranging adsorbent for adsorbing gases and moisture in a specified position inside a sealing area at which the first substrate and the second substrate that are to be superposed on each other facing mutually are sealed with the sealant applied in the shape of a picture frame, gases and moisture generated internally and gases of oxygen etc. and moisture that have invaded from the outside may be adsorbed; therefore the deterioration of emission properties of the emitting layered product composed of organic materials may be controlled, so that high-reliability and a long life may be realized.

Note that this invention is not restricted to the above-described construction and constructions of the embodiments that will be described later, but may be altered in various ways without departing from a technological scope of this invention.

BRIEF DESCRIPTION OF THE DRAWING

These and other features, objects and advantages of the present invention will become more apparent from the following description when taken in conjunction with the accompanying drawings wherein.

DETAILED DESCRIPTION OF PREFERRED EMBODIMENTS

Hereafter preferred embodiments of this invention will be described in detail with reference to the drawings of the embodiments. Note that, in the following embodiments, cases where this invention is applied to the image display apparatus using the organic EL panel will be described as examples. In the embodiments, for both the first substrate and the second substrate constituting the cap, glass substrates are used. The organic EL panel includes one whose organic material used for a part contributing emission is of a low molecular material system and one whose organic material is of a polymeric material. This invention does not intend to limit the organic material to either or both of theses material systems, and the organic EL panel whose organic material is a mixture of both the low molecular material system and the polymeric material system may be used.

Generally, a layer configuration of the first substrate of the organic EL panel of a low molecule material system is glass substrate/anode electrode/hole-injection layer/hole-transport layer/emitting layer/electron-transport layer/cathode electrode. On the other hand, generally a layer configuration of the first substrate of the organic EL panel of the polymeric material system is glass substrate/anode electrode/hole-transport layer/emitting layer/cathode electrode. In the case of the EL panel of the polymeric material system, there is a case where the hole-transport layer of this system serves as both the hole-injection layer and the hole-transport layer of the organic EL panel of a low-molecule material system in terms of characteristics, and further in the organic EL panel of the polymeric material system, there is a case where only the cathode electrode of this system substitutes the electron-transport layer and the cathode electrode of the organic EL panel of a low-molecule material system. Moreover, this invention is not restricted to materials, compositions, etc. used in the following embodiments.

Figure 1:
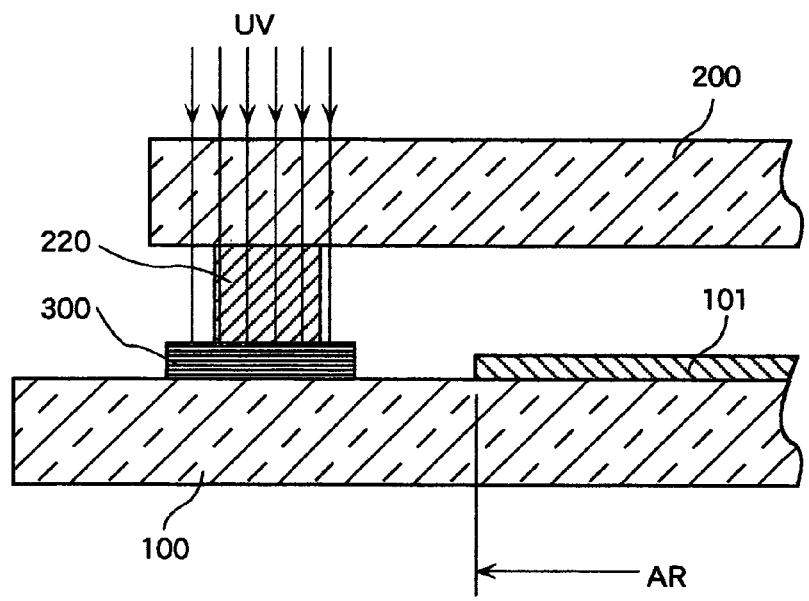
FIG. 1 is a substantial-part cross sectional view for schematically explaining the basic panel construction of the image display apparatus according to this invention.
Figure 2:
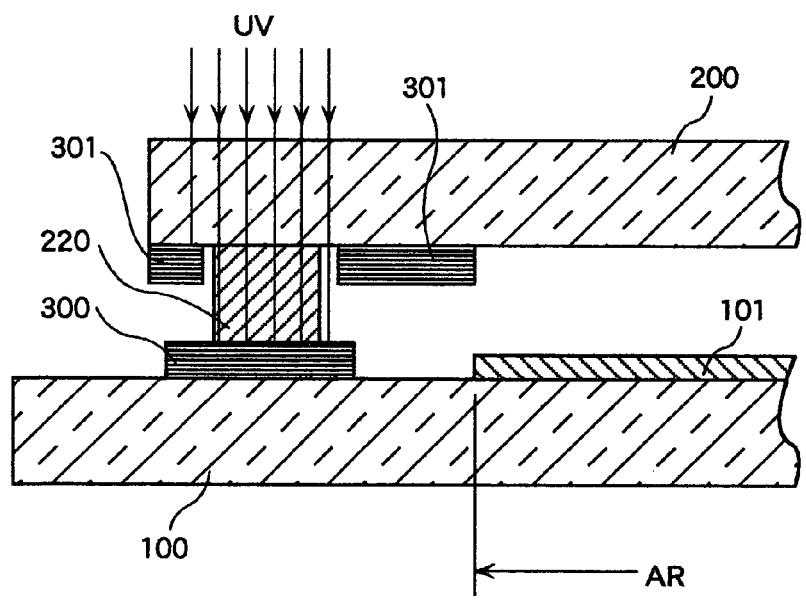
FIG. 2 is the substantial-part cross sectional view for schematically explaining another basic panel construction of the image display apparatus according to this invention.
Figure 3:
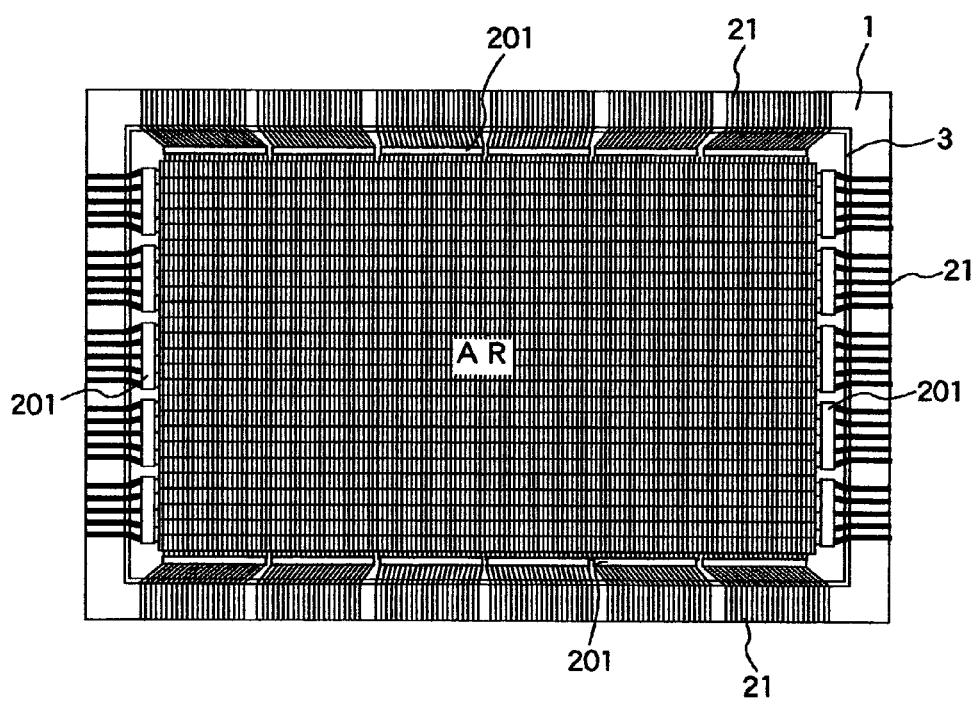
FIG. 3 is a plane view showing one of the faces of the first substrate that will be the inner side after the second substrate is sealed thereto (hereinafter referred to as simply the "inner side") and explaining one example of the organic EL panel of the image display apparatus using the organic EL panel.
Figure 4:
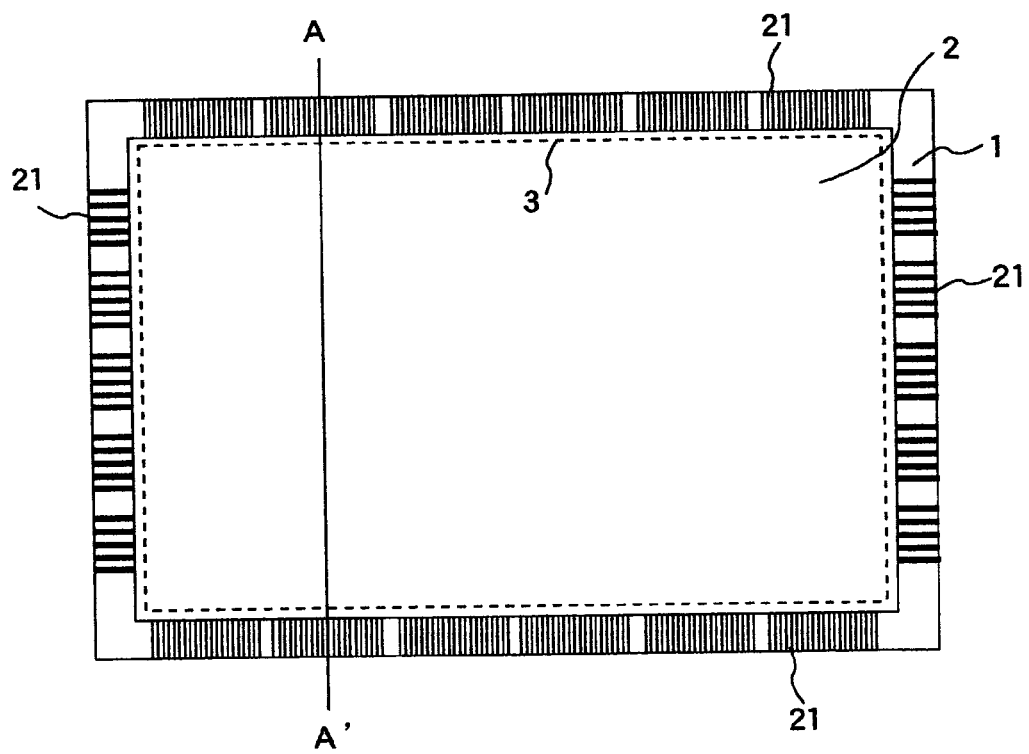
FIG. 4 is a plane view showing a state where the second substrate constituting the cap is bonded to the first substrate shown in FIG. 3 when viewed from the second substrate side.

Next, the embodiments of this invention will be described with reference to the drawings. FIG. 3 is the plane view showing the inner side of the first substrate and explaining one example of the organic EL panel of the image display apparatus using the organic EL panel. Moreover, FIG. 4 is the plane view showing a state where the second substrate constituting the cap is bonded to the first substrate shown in FIG. 3 when viewed from the second substrate side. FIG. 3 and FIG. 4 are common to the organic EL panel that will be described later. This organic EL panel has a pixel area AR formed by constituent members consisting of active elements of thin-film transistors etc., pixel electrodes (anode electrodes), emitting layers, opposing electrodes (cathode electrodes), etc. on the inner side of the first substrate 1, and drive circuits 201 for driving pixels constituting this pixel area is formed inside the geometry of a sealant 3 interposed on the picture-frame sealing area prepared thereon. These drive circuits 201 are directly formed on the first substrate 1. In the outside of the sealing area (the sealant 3), external terminals 21 that supply scan signals and data signals for display from an external signal processing unit (not shown in the figure) to the drive circuit 201 are extracted.

FIG. 4 shows a state where the second substrate 2 is bonded and sealed to the first substrate 1 with the sealant 3. The second substrate 2 is smaller than the first substrate 1 in size, so that the external terminals 21 are exposed on the peripheral edge of the first substrate 1. Incidentally, in this example, the drive circuits provided on the long side are for data driving and the drive circuits provided on the short side are for scan driving. In this example, although the drive circuits are provided inside the sealing area, there is also a form where these drive circuits are directly formed outside the sealing area, or an integrated circuit chip is installed there.

Embodiment 1

Figure 5:
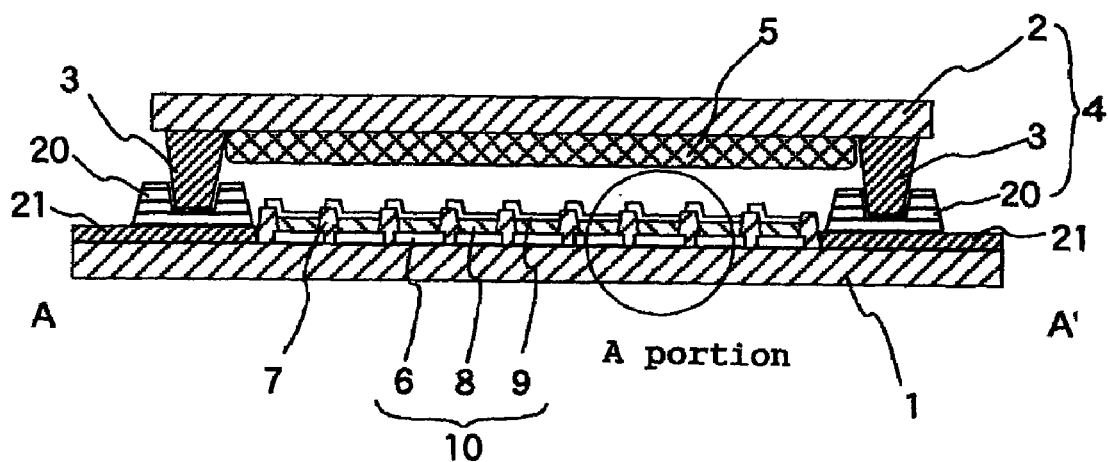
FIG. 5 is a schematic view of the organic EL panel for explaining the construction of the first embodiment of the image display apparatus according to this invention.
Figure 5:
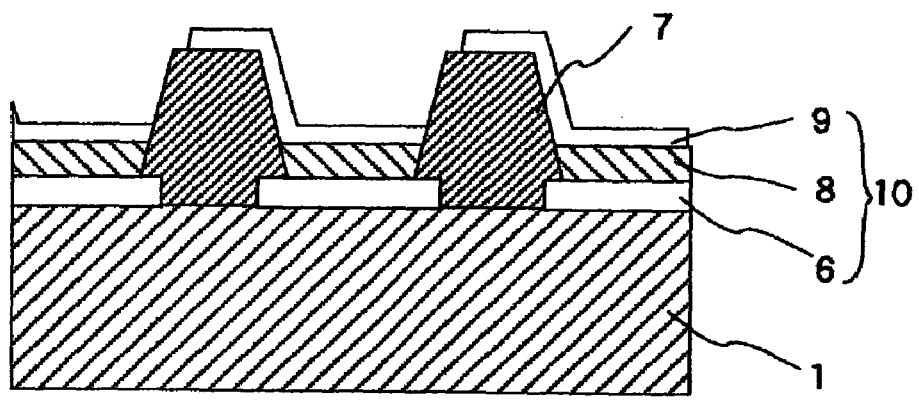

FIG. 5 is the schematic view of the organic EL panel for explaining the construction of the first embodiment of the image display apparatus according to this invention. FIG. 5(A) is a cross sectional view taken along line A–A' of FIG. 4, and FIG. 5(B) is an enlarged view of A portion in FIG. 5(A). Incidentally, illustration of the drive circuit shown in FIG. 3 is omitted in FIG. 5. In FIG. 5, reference numeral 1 denotes a first substrate, 2 a second substrate constituting the cap, and 3 a rib made integral with the second substrate on its periphery. The rib 3 is aligned to the ultraviolet-ray shield resin film 20 formed on the first substrate 1, and the substrates 1, 2 are bonded and fixed to each other with the sealant (not shown in the figure) interposed between the two substrates. Moreover, reference numeral 4 denotes a cap formed by integrating the second substrate 2 and the rib 3, 5 an adsorbent, 6 an anode electrode, 7 pixel separation banks, 8 an emitting layer, 9 a cathode electrode, and 10 an emitting layered product composed of the anode electrode 6, the emitting layer 8, and the cathode electrode 9. Moreover, reference numeral 20 denotes an ultraviolet-ray shield resin film formed in the sealing area, and numeral 21 denotes external terminals.

The first substrate 1 on which the emitting layered product 10 is formed is a light-transmitting substrate, such as a glass substrate, and the second substrate 2 constituting the cap is a light-transmitting substrate having the same properties as the first substrate 1. The cap 4 is composed of the second substrate 2 and the rib 3, and the rib 3 is formed on the periphery of the second substrate 2 so as to protrude to the first substrate 1 side. In this example, the rib 3 is a different member from the second substrate 2, and the two members are fixed integral with each other by appropriate adhering means. The emitting layered product 10 is composed of the anode electrode 6, the pixel separation banks 7, the emitting layer 8, and the cathode electrode 9. The rib 3 made integral with the second substrate 2 is formed in such a way that its area (a width area in the plane of the second substrate 2) is larger than an area in which the emitting layered product 10 is formed and its thickness is larger than a sum of thicknesses of the adsorbent 5 and of the emitting layered product 10 that the first substrate 1 has.

Incidentally, as described above, a layer configuration of a portion for contributing to emission sandwiched by the anode electrode 6 and the cathode electrode 9 may change depending on a material system (polymer systems, low molecule systems) of the emitting layer 8. As a material of the rib 3, both organic materials and inorganic materials may be used. As a formation method thereof, screen printing, a method for direct drawing with the use of a dispenser etc., a method for applying a material of the rib 3 on the entire surface of a single side of the second substrate 2 and removing unnecessary portion except the periphery thereof by means of exposure and development processes to form the rib 3, and the like may be adopted. The adsorbent 5 is for adsorbing internally generated gases generated from the emitting layered product 10 etc., the outside air and moisture that have invaded from the outside (external gases; mainly oxygen), after sealing the first substrate 1 and the second substrate 2 using the ultraviolet-ray shield resin film 20 and the rib 3 with the sealant not shown in the figure.

Figure 6:
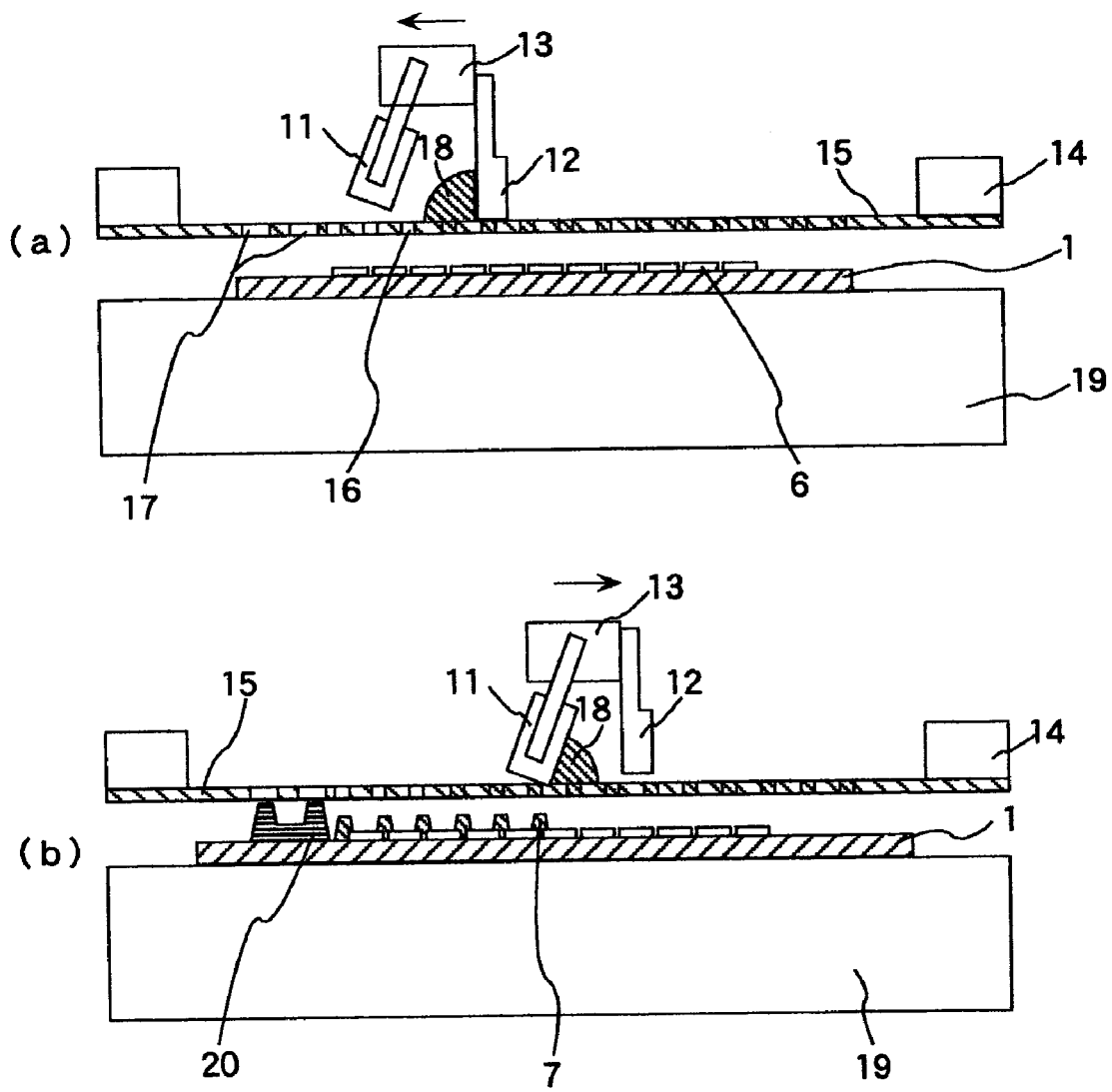
FIG. 6 is an explanatory diagram for a process of simultaneously forming the pixel separation banks and the rib in the first embodiment of this invention.

FIG. 6 is the explanatory diagram for a process of simultaneously forming the pixel separation banks and the ultraviolet-ray shield resin film in the first embodiment of this invention. Reference numeral 11 denotes a squeegee, 12 a scraper, 13 a head that has function of holding the squeegee 11 and the scraper 12 and moving up and down these members, 14 a screen form plate, 15 a screen mask, 16 an aperture pattern for transferring pixel separation banks, 17 an aperture pattern for transferring the ultraviolet-ray shield resin film 20, 18 paste of a resist (hereinafter referred to as also "ink" for convenience), 19 a substrate fixing table. In this process, the pixel separation banks 7 and the ultraviolet-ray shield resin film 20 are made of the same resist. Note that the rib has a function of aligning the two substrates.

The squeegee 11 is for applying the ink 18 of the resist carried on a squeegee-side surface of the screen mask 15 onto the opposite side thereof through the aperture pattern for transferring pixel separation banks 16 and the aperture pattern for transferring ultraviolet-ray shield resin film 17. The scraper 12 is for filling the ink 18 into the aperture pattern for transferring pixel separation banks 16 and the aperture pattern for transferring ultraviolet-ray shield resin film 17 both of which are provided in the screen mask 15. The squeegee 11 and the scraper 12 are moved vertically by the head 13. At the time of ink filling, the squeegee 11 is lift up and the scraper 12 is lift down to closely contact with the screen mask 15; at the time of ink application, the scraper 12 is lift up and the squeegee 11 is lift down to closely contact with the screen mask 15. The screen mask 15 is loaded on the frame-like screen form plate 14. In FIG. 6, the screen form plate 14 is shown only by a pair of the frame sides.

Aperture areas of the aperture pattern for transferring ultraviolet-ray shield resin film 17 existing in the screen mask 15 must be formed larger than aperture areas of the aperture pattern for transferring pixel separation banks 16 surely. This condition is based on a finding of the present inventors that in the screen printing, a difference in the width (here, to make explanation easy to understand, printing features in the form of a line is assumed and the aperture size is specified by its width) of the aperture of the screen mask 15 results in variation in the application thickness of the ink. So, in order to make the application thickness of the ink for ultraviolet-ray shield resin film thicker than the application thickness of the ink for the pixel separation banks and make it possible to apply both inks simultaneously, the width of the aperture pattern for transferring ultraviolet-ray shield resin film 17 is made larger than the width of the aperture pattern for transferring pixel separation banks 16. That is, when the width of aperture of the screen mask 15 becomes larger than a certain width of boundary value, the application thickness becomes constant; whereas with decreasing width below that certain width of boundary value, the application thickness tends to decrease. By utilizing this phenomenon, ink applied portions each having a different thickness may be formed simultaneously on the same plane.

Incidentally, this tendency of the application thickness of ink to the line width may differ depending on a substance of ink and specifications of the screen form plate. In this embodiment, "black super fine particle NanoTek Black-1" from C.I. Kasei Co., Ltd. is mixed to "screen printing polyimide PP-200" from Central Glass Co., Ltd. at a concentration of 3% by volume to obtain a substance whose optical transmittance is 0.05% or less in a light wavelength range of 300 nm to 800 nm, being almost nontransparent to light, which is used as a material of the ink for pixel separation banks and as a material of the ink for ultraviolet-ray shield resin film. Moreover, as the screen mask 15, a #500 stainless mesh product made of stainless wire of a wire diameter of 18 μm that has an apertures size of 33 μm and a numerical aperture of 42% on which an emulsion excellent in solvent resistance (product name: NSL) from Tokyo Process Service Co., Ltd. is formed to a thickness of 30 μm was used.

With a combination of the ink material and the screen mask 15, when the application line width exceeds 150 μm, the film is formed to a thickness almost equal to the emulsion thickness of the screen mask 15, whereas with decreasing line width below 150 μm, the film thickness of the ink applied and formed decreases, and the film thickness becomes approximately 5 μm for a line width of 20 μm.

That is, when the width of the aperture pattern for ultraviolet-ray shield resin film 17 is set larger than 150 μm and the width of the aperture pattern for transferring pixel separation banks 16 is set to 20 μm, the ultraviolet-ray shield resin film made of the ink film of a thickness of 30 μm may be formed simultaneously with the pixel separation banks made of the ink film of a thickness of 5 μm. If the film has a thickness of about 30 μm, it is possible to obtain an effect as a guide to be used for alignment sufficiently. Note that conditions for simultaneously transferring two items having different application thicknesses by screen printing are not restricted to those for the ink material and the screen mask of the specifications.

As shown in FIG. 6(A), the cathode electrode 6 formed on the first substrate 1 is aligned with respect to the aperture pattern for transferring pixel separation banks 16 of the screen mask 15 attached to the screen form plate 14, and the first substrate 1 is placed and fixed on the substrate fixing table 19. In this embodiment, minute vacuum suction holes are made on the substrate fixing table 19, and the screen mask 15 is vacuum sucked and fixed using a vacuum pressure from these vacuum suction holes. Next, the ink 18 is placed on the screen mask 15, the squeegee 11 is lift up by the head 13, and the scraper 12 is lift down to closely contact with the screen mask. Subsequently, while the scraper 12 is being moved to scrape the ink 18, the ink 18 is filled in the aperture pattern for transferring pixel separation banks 16 and the aperture pattern for transferring ultraviolet-ray shield resin film 17. In FIG. 6(A), the ink filling is attained by moving the scraper 12 from the right to the left.

Next, as shown in FIG. 6(B), by lifting up the scraper 12 with the head 13, lifting down the squeegee 11 to closely contact with the screen mask 15, and moving the squeegee 11 from the left to the right, the ink 18 filled in the aperture pattern for transferring pixel separation banks 16 and in the aperture pattern for transferring ultraviolet-ray shield resin film 17 is transferred onto the first substrate 1. Thereby, the pixel separation banks 7 are formed in such positions as to partition the cathode electrode 6. Concurrently with this, the ultraviolet-ray shield resin film 20 whose thickness is thicker than that of the pixel separation banks 7 and can yield the effect as a guide for aligning the substrates with each other sufficiently is formed in the outer area of the display area of the first substrate 1.

Figure 7:
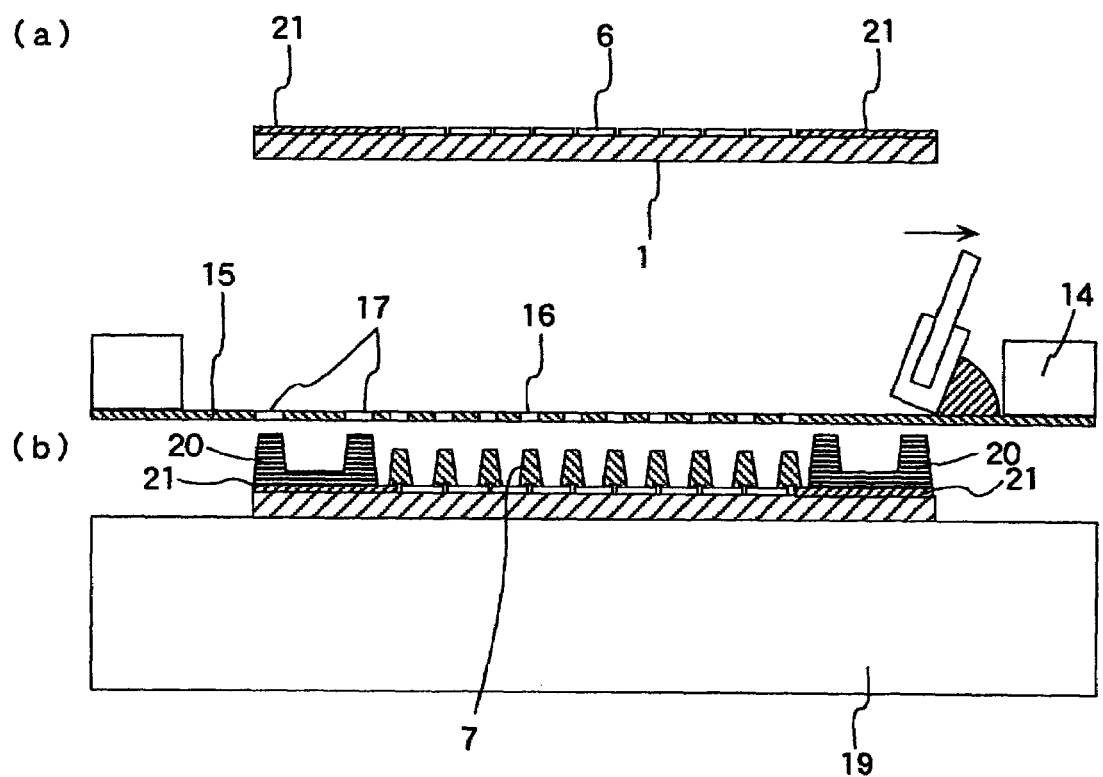
FIG. 7 is a process chart for explaining the first embodiment of a process for production of the organic EL image display apparatus to which this invention is applied.
Figure 8:
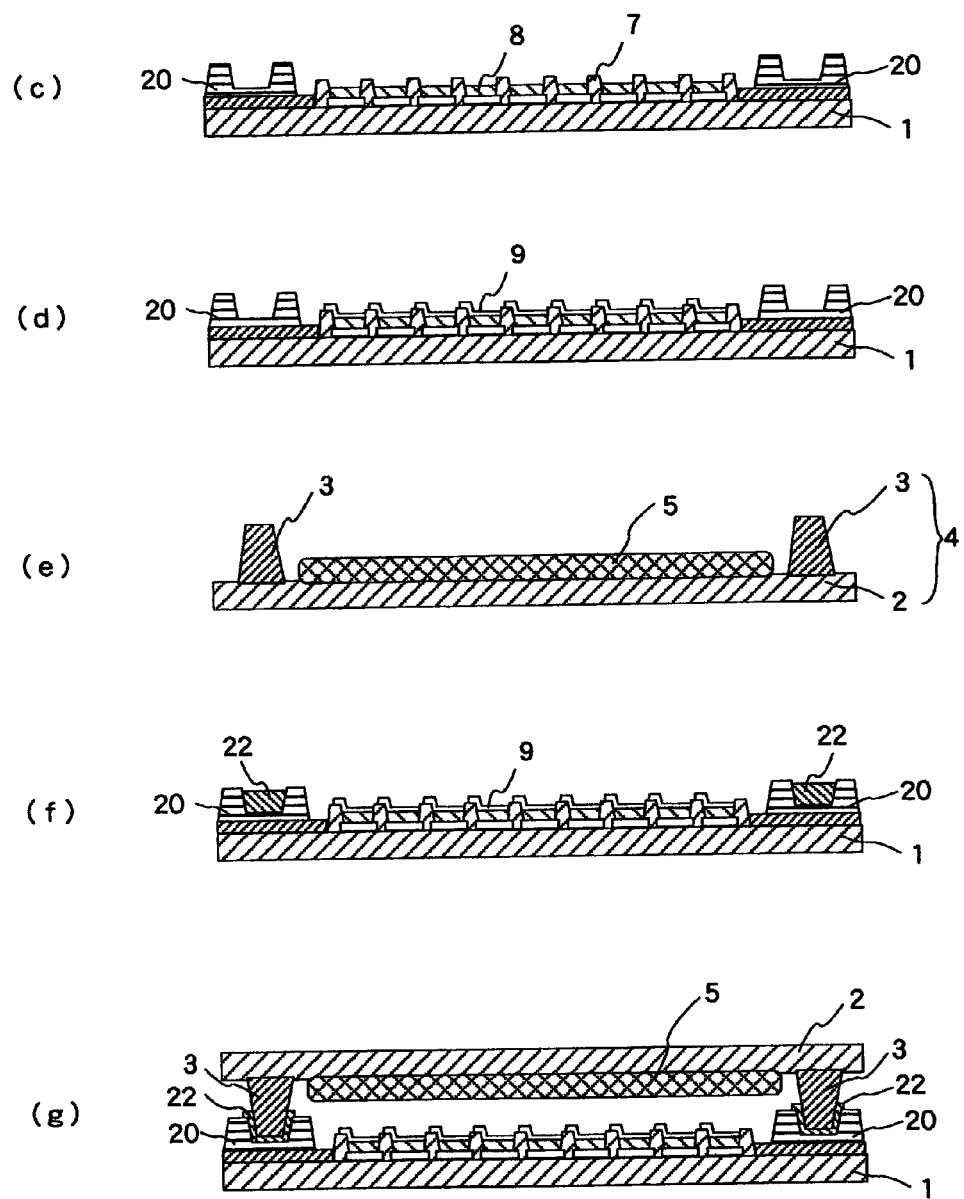
FIG. 8 is a process chart following FIG. 7, explaining a first embodiment of the process for production of the organic EL image display apparatus to which this invention is applied.

FIG. 7 and FIG. 8 are the process chart for explaining the first embodiment for the process for production of the organic EL image display apparatus to which this invention is applied. Note that FIGS. 7(A) and (B) continue to FIGS. 8(C) to (G). In FIG. 7 and FIG. 8, reference numeral 21 denotes external terminals, numeral 22 denotes a sealant, and the same reference numeral as those shown in FIG. 5 and FIG. 6 correspond to the same functional parts. In this embodiment, first, as shown in FIG. 7(A), the anode electrode 6 and the external terminals 21 are formed on one side of the first substrate 1 on which the emitting layer is formed. In this embodiment, for the second substrate constituting the cap, a glass substrate having the same properties as the first substrate 1 ("#1737" from Corning Corporation) was used. Moreover, in this embodiment, in order to form the emitting layer in the nominal 15 inch size with a slenderness ratio of 3:4, the size of the glass substrate was set to 348 mm×267 mm, each side being larger than the size of the emitting layer by 20 mm.

The thickness of the glass substrate used as the first substrate 1 is 0.7 mm. For the anode electrode 6, a transparent conductive material etc. is used. As this material, there are ITO (Indium Tin Oxide), IZO (Indium Zinc Oxide), SnO$_2$, etc. Moreover, for the external terminals 21, materials with high conductivity are preferable, and Cr, Mo—Ta, Ta, Al, Cu, etc. may be used. In this embodiment, the anode electrode 6 and the external terminals 21 were formed by coating a conductive material on the entire surface of the first substrate 1 by sputtering and then performing exposure and development. Note that, regarding the surface of the anode electrode 6, smoother surface is preferable.

Incidentally, in this embodiment, ITO whose sheet-resistivity is about 10 Ω/cm$^2$ or less was used as a material of the anode electrode 6. Regarding the external terminals 21, its pattern is formed using ITO concurrently with the formation of the anode electrode 6 and redundant wiring is formed using a material with high electric conductivity, whereby the external terminals can have a lower resistance and may be prevented from being disconnected.

Next, as shown in FIG. 7(B), the first substrate 1 was held on a substrate fixing table 19 so that the anode electrode 6 and the external electrodes 21 face upward, and the pixel separation banks 7 and the ultraviolet-ray shield resin film 20 whose thickness is thicker than that of the pixel separation banks 7 were formed by applying the ink simultaneously according to the method explained in FIG. 6, and. Further, a material of the pixel separation banks 7 and a material of the ultraviolet-ray shield resin film 20 are identical. For its concrete material, there are polyimide paste, maleimide varnish, polyamide paste, etc., and one with high thixotropy is preferable because of shape preserving property. Moreover, it is not restricted to polyimides, and any material having less hygroscopicity and less gas generation may be used.

As described above, "black super fine particle NanoTek Black-1" from C.I. Kasei Co., Ltd. is mixed to "screen printing polyimide PP-200" from Central Glass Co., Ltd. at a concentration of 3% by volume to obtain an ink whose optical transmittance is 0.05% or less in a light wavelength range of 300 nm to 800 nm, being almost nontransparent to light, which is used as the ink for pixel separation banks 7 and ultraviolet-ray shield resin film 20 in this embodiment. After applying this ink, the ambient temperature of the ink was raised from the normal temperature to 220° C. in an atmosphere of nitrogen by a speed of 5° C./min., and when the temperature reached 220° C., it was held for 60 min. to harden the ink. Moreover, as the screen mask 15, a #500 stainless steel mesh product that is made of a stainless wire of a wire diameter of 18 μm and has an aperture size of 33 μm and an aperture area of 42% on which an pattern is formed using an emulsion made of a photosensitve resin for screen mask formation and having excellent solvent resistance (product name: NSL) from Tokyo Process Service Co., Ltd. is used.

In this embodiment, a display area of one pixel is 180 μm long and 80 μm wide, and its pitch is 300 μm in the vertical direction and 100 μm in the horizontal direction. Since the pixel separation banks 7 needs to cover areas besides the display area, its size becomes 120 μm for the horizontal line width and 20 μm for the vertical line width, and the pitch is 300 μm for the horizontal line and is 100 μm for the vertical line. The size of a formation area of the pixel separation banks 7 is 308 mm×231 mm, a nominal diagonal size of 15 inches, pixels are arranged in specified positions in a matrix form: 1024×3 (three colors: red, green, and blue) pieces in the horizontal direction, totally 3072 pieces, and 768 pieces in the vertical direction. Moreover, the thickness of the pixel separation banks 7 is determined by desired thicknesses of the emitting layer, the hole-transport layer, etc. after their formation and layer stacking of the layers. The luminescent material used in this embodiment is of a high polymer system.

Further, a configuration of the emitting layered product is anode electrode/hole-transport layer/emitting layer/cathode electrode. The anode electrode and the cathode electrode were formed by sputtering and deposition, and the hole-transport layer and the emitting layer were applied by the inkjet method. The anode electrode and cathode electrode formed by sputtering and deposition do not vary largely in film thickness immediately after the formation and thereafter, and their film thickness is about 100 nm. On the other hand, since the hole-transport layer and the emitting layer are applied by the inkjet method, a material solution diluted with a solvent is used. Therefore, their film thicknesses change largely before (immediately after the application) and after the ink is dried and the solvent is volatilized.

In this embodiment, for the hole-transport layer and for the emitting layers of red, green, and blue, solutions each with a solid concentration being diluted to 3% are used and the thicknesses after drying are designed to 0.1 μm, respectively, and for this purpose the film thicknesses in an undried state immediately after the application are 3 μm. In the case where a layer is formed using an ink diluted with a solvent by means of ink jet etc., the thickness of the pixel separation banks 7 is determined by the film thickness immediately after the application of the diluted ink. In this embodiment, since the film thickness of the hole-transport layer and the emitting layers of red, green, and blue immediately after the application is 3 μm, the thickness of the pixel separation banks was set to 5 μm, being larger than that value. When the ink for pixel separation banks is applied to a film thickness of 5 μm with a line width of 20 μm, the thickness of the emulsion necessary to form the pattern for the screen mask 15 is 30 μm.

Note that, as described above, if the line width exceeds a certain width of boundary limit, the application thickness is constant, whereas if the line width is decreasing below the certain value of boundary limit, the application thickness tends to decrease gradually. With a combination of the pixel separation banks material and the screen mask, the dependency of the application thickness on the width of aperture of the screen mask changes on a boundary width of aperture of the screen mask of 150 μm. That is, if a vertical line with a width of 20 μm and a horizontal line with a width of 120 μm are formed with a screen mask that has apertures with those widths, the vertical line with a width of 20 μm is applied to a film thickness of about 5 μm, whereas the horizontal line with a width of 120 μm is applied to a film thickness of about 25 μm, which is close to the emulsion thickness of the screen form plate, and hence even for features of the same pixel separation banks, the vertical line and the horizontal line make a great difference.

Then, in order to equalize the thicknesses of the vertical line and of the horizontal line in the pixel separation banks, the vertical line width of 120 μm is divided into three lines each with a width of 25 μm separated by a space of 22.5 μm, and after the horizontal line is printed to a thickness thicker than that of the vertical line with a width of 20 μm, the ink is made to flow into the space area and undergoes leveling, whereby the thickness of the vertical line is equalized to the same height as that of the vertical line while the spaces are filled up with the ink.

Regarding the thickness of the ultraviolet-ray shield resin film 20, thicker thickness is preferable in order to provide it with a guiding function when the rib of the second substrate is aligned therewith. Since when the screen mask is used, the line width that does not affect the film thickness is 150 μm or more, the width of the ultraviolet-ray shield resin film 20 is set to 200 μm, being larger then that width, and is formed doubly in a concentric manner on frames of 320 mm×243 mm and 324 mm×247 mm so as to encircle a emitting-layer formation area. Incidentally, in this embodiment, the ultraviolet-ray shield resin film 20 to be aligned to the rib is so formed as to have the inner peripheral protrusion and the outer peripheral protrusion that runs around doubly on the sealing area in the outer area of the substrate. Moreover, in the case where the ultraviolet-ray shield resin film 20 is formed doubly in a concentric manner, it is necessary to form the ink for ultraviolet-ray shield resin film also in an area between the concentric protrusions.

Figure 9:
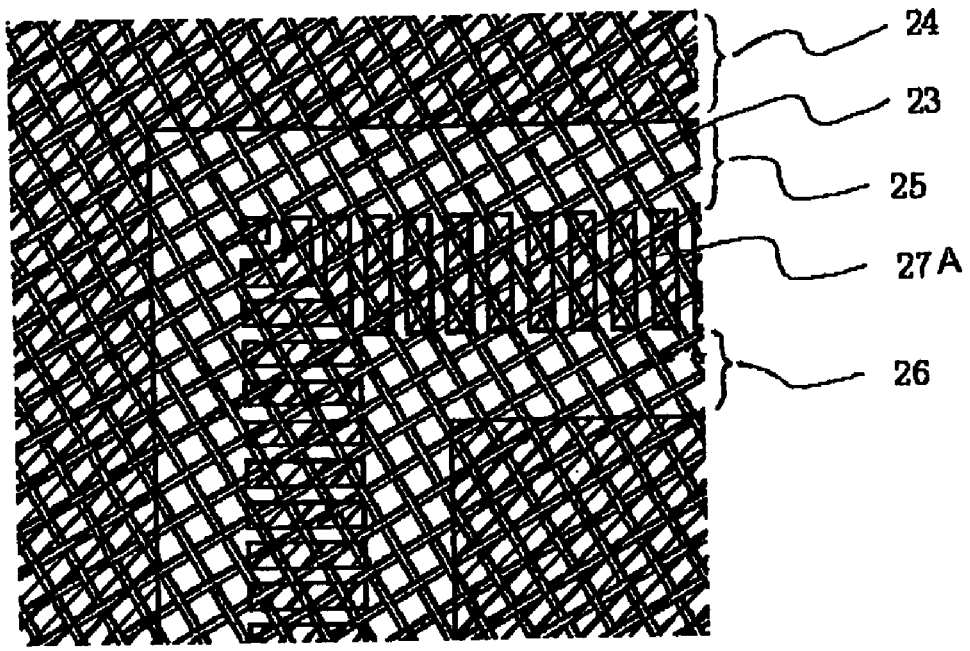
FIG. 9 is a partial plane view for explaining the outline of one example of the composition of the screen mask used for production of the image display apparatus of this invention.

FIG. 9 is the partial plane view for explaining the outline of one example of the composition of the screen mask used for production of the image display apparatus of this invention. FIG. 9 is a view of a corner portion of the screen mask. As shown in FIG. 9, a pattern is formed on the stainless steel mesh 23 with an emulsion 24, and the ink will be printed on the first substrate through portions in which the emulsion 24 has not been solidified. Using the screen mask as shown in FIG. 9, between the first pattern for ultraviolet-ray shield resin film (outer peripheral protrusion) 25 located in an outer portion of the outer area of the first substrate and the second pattern (inner peripheral protrusion) 26 located in an inner portion of the outer area thereof (i.e., in a space area between the two protrusion), a third pattern (strip pattern) 27A with a width of 25 μm, the same width as that of the pixel separation banks 7, is printed in a direction perpendicular to these patterns with a 45 μm pitch for the entire circumference.

By using such a screen mask, the ink is made to flow into the space area and undergo the leveling after the ink was printed thickly, whereby the space area is filled up with the ink to a thickness thinner than that of the both sides, so that the ultraviolet-ray shield resin film 20 with a recess-like cross section may be formed.

Figure 10:
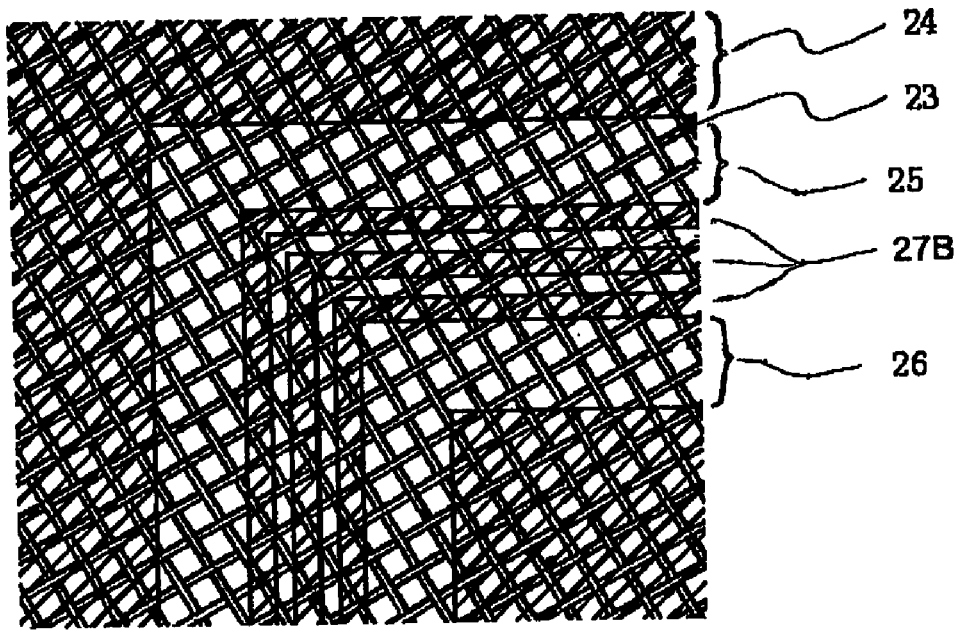
FIG. 10 is a partial plane view for explaining the outline of another example of the composition of the screen mask used for production of the image display apparatus of this invention.

FIG. 10 is the partial plane view for explaining the outline of another example of the composition of the screen mask used for production of the image display apparatus of this invention. As shown in FIG. 10, a third pattern 27B consisting of lines each with a width of 25 μm in a direction parallel to these patterns (line pattern) may be formed with a 45 μm pitch for the entire circumference between the first pattern for ultraviolet-ray shield resin film 25 formed in the outer portion of the outer area of the first substrate and the second pattern 26 formed in the inner portion of the outer area thereof. Similarly with the case of FIG. 9, by using this screen mask, after the ink was printed thickly, the ink is made to flow into the space area and undergo the leveling, whereby the space areas are filled up with the ink to a thickness thinner than that of the both sides, so that the ultraviolet-ray shield resin film 20 with a recess-like cross section may be formed.

Figure 11:
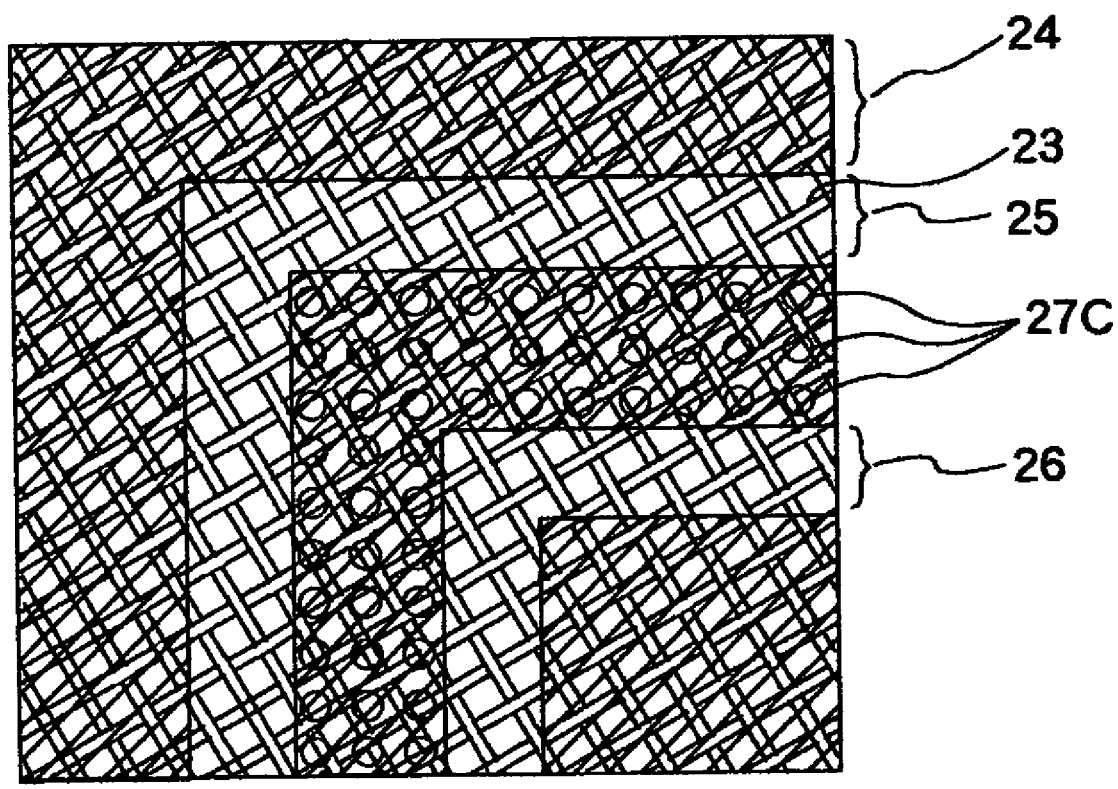
FIG. 11 is a partial plane view for explaining the outline of further another example of the composition of the screen mask used for the first embodiment of this invention.

FIG. 11 is the partial plane view for explaining the outline of further another example of the composition of the screen mask used for the first embodiment of this invention. As shown in FIG. 11, it is also possible that between the first pattern 25 for ultraviolet-ray shield resin film formed on the outer portion of the outer area of the first substrate and the second pattern 26 formed on the inner portion of the outer area thereof, a group of a third pattern 27C (dot pattern) with a diameter of 25 µm or more is formed for the entire circumference. Similarly with the cases of FIG. 9 and FIG. 10, by using this screen mask, after the ink was printed thickly, the ink is made to flow into the space area and undergo the leveling, whereby the space areas are filled up with the ink to a thickness thinner than that of the both sides, so that the ultraviolet-ray shield resin film 20 with a recess-like cross section may be formed.

Note that the screen mask is not restricted to the patterns and that by forming a mesh-like pattern or other non-continuos/continuos pattern between the first pattern 25 and the inner peripheral second pattern 26 of the ink that will become the ultraviolet-ray shield resin film and making the printed ink undergo the leveling, the space areas are filled up with the ink and the ultraviolet-ray shield resin film 20 with a recess-like cross section may be formed.

Next, returning to FIG. 8, as shown in FIG. 8(C), the emitting layer 8 is formed inside the pixel separation banks 7. In addition, in this embodiment, as described above, the emitting layer of a polymeric material system is used, the configuration of the emitting layer sandwiched between the anode electrode and the cathode electrode was specified to hole-transport layer/emitting layer, and the ink of the former and the ink of the latter were applied on an area inside the pixel separation banks adjoining each other, respectively. As application methods, there are the screen printing method, the inkjet method, etc., and the inkjet method was used in this embodiment.

In addition, the hole-transport layer is set common to the three colors. As an ink for the hole-transport material, used was a water colloidal solution ("BYTORON P-CH-8000," a product of Bayer Inc.) containing poly(3,4-ethylene dioxythiophene) that is a conductive polymer and polystyrene sulfonic acid that is a dopant. Moreover, as inks of light emitting materials for emitting lights of respective colors, the following solutions are used: for green, "Green-K" of Dow Inc. mixed with 1,2,3,4-tetramethylbenzene; for red, "Red-F" of Dow Inc. mixed with 1,2,3,4-tetramethylbenzene; and for blue, "Blue-C" of Dow Inc. mixed with 1,3,5-trimethylbenzene. Incidentally, although in this embodiment the hole-transport layer is set common for the three colors, a material and film thickness may be changed for each color at the expense of reduced productivity.

Next, as shown in FIG. 8(D), the cathode electrode 9 is formed by the vacuum deposition method on the emitting layers of red, green, and blue that are formed in the predetermined areas between the neighboring pixel separation banks 7 of the first substrate 1. In this embodiment, Al/Ca was used as a material of the cathode electrode 9. Note that, for the cathode electrode, any material whose work function is small may be used, and the material is not limited to Al/Ca.

Next, as shown in FIG. 8(E), the rib 3 is formed to the shape of a picture frame and in a protruding manner on the periphery of the second substrate 2 constituting the cap to prepare the cap 4. The substrates 1, 2 are superposed on each other while the area encircled by the rib 3 is faced to the display area of the first substrate 1. In this superposition, the adsorbent 5 was installed on the entire area that does not interfere with the rib 3 formed to the shape of a picture frame on the periphery of the second substrate 2. In this embodiment, for the second substrate 2, a glass substrate having the same properties as the first substrate 1 ("#1737" from Corning Inc.) was used. This glass substrate 1 measures 0.7 mm in substrate thickness and 328 mm×246 mm in planar dimensions. Moreover, as explained in FIG. 3, this adsorbent 5 is for adsorbing gases that are generated from the emitting layer composed of organic materials and the outside air and moisture that have invaded the interior passing through the sealing material (sealant) after the cap 4 and the first substrate 1 were superposed and sealed with the sealant serving as a sealing material.

In this embodiment, since the ultraviolet-ray shield resin film 20 was formed to a thickness of 30 µm, the thickness of the rib 3 made integral with the second substrate 2 was set to 500 µm. Methods of forming the ultraviolet-ray shield resin film 20 include screen printing, a method for direct drawing with a dispenser, and a method for forming the film in the entire surface of the substrate with a spinner etc. and removing unnecessary portions except the surroundings by exposure and development. In this embodiment, screen printing was used, the size of the frame-like structure is set to 322 mm×245 mm with a line width to be printed being set to 1800 µm, and the size of the ultraviolet-ray shield resin film is set to 320 mm×243 mm for the inner side and 324 mm×247 mm for the outer side. On the other hand, side faces of the rib 3 made integral with the second substrate are specified to come in contact with both inner side and outer side of the printing line of the ultraviolet-ray shield resin film.

Moreover, as a material of the rib 3 made integral with the second substrate 2, a preferable material is one that has excellent adhesiveness to the surface of the second substrate 2, less hygroscopicity, less gas generation etc., and a high sealing effect by itself, and does not allow the outside air and moisture to pass through an interface between itself and the substrate constituting the cap and through itself. Moreover, by using a material that absorbs less ultraviolet rays as the material for the rib 3 made integral with the second substrate 2, if a sealant made up of an ultraviolet curing material is used as the sealant acting as the sealing material, the sealant may be cured by irradiating ultraviolet rays from the second substrate 2 side. This irradiation scheme allows ultraviolet rays to be irradiated on the sealant much uniformly than the irradiation from the first substrate side that gives rise to shielded portion in ultraviolet rays by the external terminals 21, and hence the sealant may be cured more stably in the plane of the substrate.

In this embodiment, for the rib 3 made integral with the second substrate 2, a transparent dielectric glass material for screen printing was used. As a transparent dielectric glass material, a borosilicate glass system and a lead glass system that are of a low-temperature firing type may be used. In this embodiment, a low-temperature firing type borosilicate glass from Nippon Electric Glass Co., Ltd. was used.

Next, as shown in FIG. 8(F), the sealant 22 is applied in a frame-like groove (recess part) sandwiched by the inner part and the outer part of the ultraviolet-ray shield resin film 20. As an application method for this, there are dispenser printing and screen printing. In this embodiment, the sealant 22 was applied with the dispenser. Moreover, as in this embodiment, by adopting a method wherein the ultraviolet-ray shield resin film 20 having also a function of aligning with the help of the rib 3 made integral with the second substrate 2 is shaped so that its cross section takes the shape of a recess and the sealant 22 is applied in the recess, even a sealant with low viscosity will not flow out outside the ultraviolet-ray shield resin film 20.

As a material of this sealant 22, there are ultraviolet curing materials, temperature curing materials, ultraviolet and temperature curing materials. In the case where the ultraviolet curing material or the ultraviolet and temperature curing material is used, ultraviolet rays are scattered and irradiated on part of the organic EL layer near the sealant at the time of irradiation of ultraviolet rays, and hence there is a possibility that deterioration of the brightness (life shortening) will occur. Moreover, in the case where the temperature curing material or the ultraviolet-ray and temperature curing material is used, if the sealant is cured at a temperature exceeding 100° C., the curing affects the organic EL layer as is the case of ultraviolet rays, and hence there is a possibility that deterioration of the brightness and life shortening will occur. In this embodiment, as the sealant 22, an ultraviolet-ray and temperature curing material that needs to undergo primary curing with irradiation of ultraviolet rays and next undergo secondary curing (main curing) with heating at 80° C. was used. As a material of the ultraviolet-ray and temperature curing sealant, "30Y-296G" from Three Bond Co., Ltd. was used.

Next, as shown in FIG. 8(G), the first substrate 1 and the second substrate 2 constituting the cap 4 were superposed with predetermined physical relationship. This superposition is realized by a self-alignment effect of the recess of the ultraviolet-ray shield resin film 20 of the first substrate 1 and the rib 3 of the second substrate 2. Then, a shielding mask for shielding the display area so that ultraviolet rays did not leak in the display area provided on the first substrate 1 was placed on the top face of the second substrate 2 to shield necessary portions fully, and subsequently ultraviolet rays UV were irradiated from the second substrate 2 side to cure the sealant 22.

In this embodiment, irradiation of ultraviolet rays on the emitting layered product formation area from the second substrate 2 side may be shielded not only with this shielding mask but also with it plus the adsorbent 5. Moreover, since the recessed ultraviolet-ray shield resin film 20 can prevent ultraviolet rays from invading the glass plate of the first substrate 1, deterioration of the emitting layered product consisting of organic materials caused by ultraviolet rays being scattered and propagating inside the first substrate 1 may be prevented. Moreover, at this time, the cap 4 and the first substrate 1 that have been superposed will not get out of position from each other without any constraint in a direction parallel to the plane of substrates because of the rib 3 of the second substrate 2 and the ultraviolet-ray shield resin film 20.

Next, they were heated in an oven at 80° C. to make the sealant 22 go through the second curing (main curing). Note that all of these operations were conducted in the nitrogen that was an inert gas. Since in locations where the two substrates are sealed by the sealant 22, the recess of the ultraviolet-ray shield resin film 20 and the rib 3 provided on the second substrate 2 constituting the cap 4 are meshed with each other, bonding distance (width) of the sealant becomes longer than that in the case where the two substrates are joined together at flat portions with the sealant of the same width, and hence invasion of the outside air and moisture are prevented more satisfactorily. In this way, a The image display apparatus is assembled by applying voltages and signals for display on the external terminals 21 of the organic EL panel thus produced or by connecting a drive circuit thereto.

Embodiment 2

Figure 12:
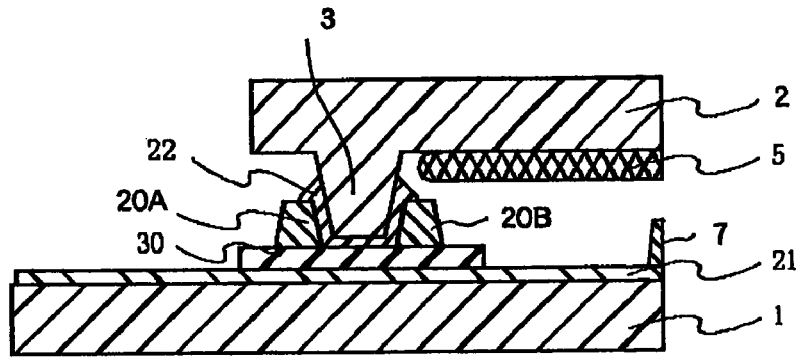
FIG. 12 is a substantial-part schematic cross sectional view of the organic EL panel, explaining a second embodiment of the image display apparatus according to this invention.

FIG. 12 is the substantial-part schematic cross sectional view of the organic EL panel, explaining the second embodiment of the image display apparatus according to this invention. In the figure, the same reference numerals as those shown in the figures of the embodiment denote the same functional parts. In this embodiment, the ultraviolet-ray shield resin film formed on the first substrate 1 is specified to be two layers: a lower ultraviolet-ray shield resin film 30 is formed on the first substrate 1, and two ultraviolet-ray shield resin films 20A (corresponding to the outer peripheral protrusion) and 20B (corresponding to the inner peripheral protrusion) are provided thereon in a concentric manner. In this embodiment, the rib 3 provided on the second substrate 2 was formed using a blasting method or a chemical etching method on a glass plate constituting the second substrate 2.

The lower ultraviolet-ray shield resin film 30 is formed by the same printing method as that shown in FIG. 6 simultaneously with the pixel separation banks 7. The ultraviolet-ray shield resin films 20A, 20B are formed on this lower ultraviolet-ray shield resin film 30 using a screen mask that is different from the screen mask for forming the pixel separation banks 7 and the lower ultraviolet-ray shield resin film 30. Note that as a material (ink) of the lower ultraviolet-ray shield resin film 30, the same material as that of the pixel separation banks 7 and the ultraviolet-ray shield resin films 20A, 20B is used. The lower ultraviolet-ray shield resin film 30 is formed in such a way that at least a space area existing between the ultraviolet-ray shield resin films 22A, 22B is covered up from the first substrate 1 side.

An ultraviolet-ray shielding structure of this embodiment allows the rib 3 made integral with the second substrate 2 to be formed to a width that engages with a large space area formed between the ultraviolet-ray shield resin films 20A, 20B. That is, it becomes possible to enlarge a sealing width of the rib 3 provided on the second substrate.

The lower ultraviolet-ray shield resin film 30 prevents the ultraviolet rays passing through the space area from entering the first substrate 1. Thereby, in addition to the effect of the first embodiment, the sealing distance between the first substrate 1 and the second substrate 2 becomes still larger, which can suppress invasion of gases and moisture from the sealing part surely.

Embodiment 3

Figure 13:
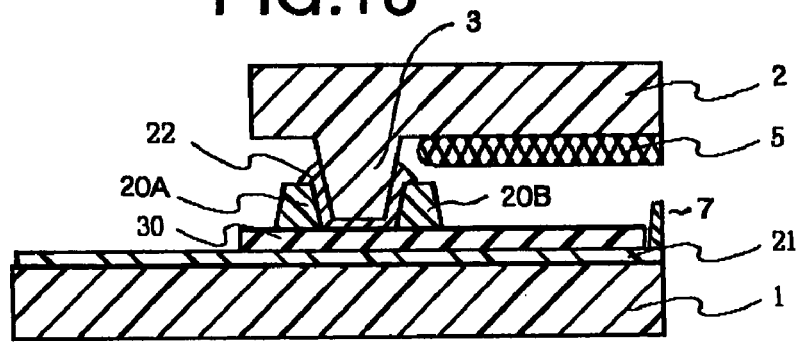
FIG. 13 is a substantial-part schematic cross sectional view of the organic EL panel, explaining a construction of a third embodiment of the image display apparatus according to this invention.

FIG. 13 is the substantial-part schematic cross sectional view of the organic EL panel, explaining the construction of the third embodiment of the image display apparatus according to this invention. In the figure, the same reference numerals as those shown in FIG. 12 denote the same functional parts. In this embodiment, the second substrate 2 having the same structure as that shown in FIG. 12, and the lower ultraviolet-ray shield resin film 30 to be formed on the first substrate 1 was formed so as to extend near the pixel separation banks 7. By this arrangement, the ultraviolet rays that may leak from the second substrate 2 side at the time of curing the sealant 22 are absorbed by the lower ultraviolet-ray shield resin film 30, and thereby the emitting layered products may be protected from the ultraviolet rays. Other effects are the same as those of the second embodiment.

Embodiment 4

Figure 14:
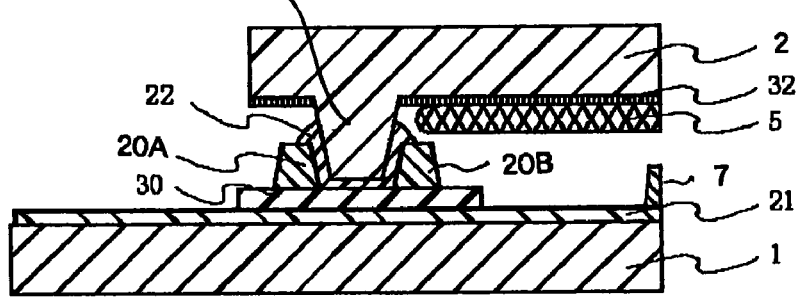
FIG. 14 is a substantial-part schematic cross sectional view of the organic EL panel, explaining a construction of a fourth embodiment of the image display apparatus according to this invention.

FIG. 14 is the substantial-part schematic cross sectional view of the organic EL panel, explaining the construction of the fourth embodiment of the image display apparatus according to this invention. In the figure, the same reference numerals as those shown in FIG. 12 and FIG. 13 denote the same functional parts. In this embodiment, the upper ultraviolet-ray shield resin film 32 was formed on the inner side of the second substrate 2, and an adsorbent 5 was provided thereon. The construction of the first substrate 1 is the same as that shown in FIG. 12. By the provision of the upper ultraviolet-ray shield resin film 32 on the second substrate 2, ultraviolet rays irradiated from the second substrate 2 side to cure the sealant 22 maybe prevented more effectively from invading the pixel area. Other effects are the same as those of FIG. 12.

Embodiment 5

Figure 15:
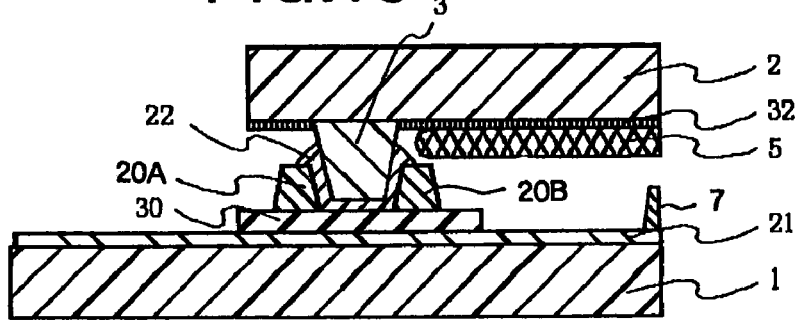
FIG. 15 is a substantial-part schematic cross sectional view of the organic EL panel explaining a construction of a fifth embodiment of the image display apparatus according to this invention.

FIG. 15 is the substantial-part schematic cross sectional view of the organic EL panel, explaining the construction of the fifth embodiment of the image display apparatus according to this invention. In the figure, the same reference numerals as those shown in FIG. 12 and FIG. 13 denote the same functional parts. In this embodiment, the rib 3 to be provided on the second substrate 2 is constructed with a frame-like member different from the second substrate 2 and is adhered to the periphery of the second substrate 2 using appropriate adhering means to prepare the cap. Other constituent members are the same as those shown in FIG. 14. A material of the rib 3 may be anything that transmits ultraviolet rays: a transparent, low thermal-expansion, low melting-point glass material (an amorphous silica-borosilicate glass system, an eucryptite-lead glass system, etc.), and a silica dispersion-type transparent polyimide material, etc. may be used. The same effects as described in FIG. 14 may be obtained according to this embodiment. Incidentally, the lower ultraviolet-ray shield resin film 30 of FIG. 14 and FIG. 15 may also be provided extendedly as far as the neighborhood of the pixel separation banks 7 similarly with the case of FIG. 13.

Embodiment 6

Figure 16:
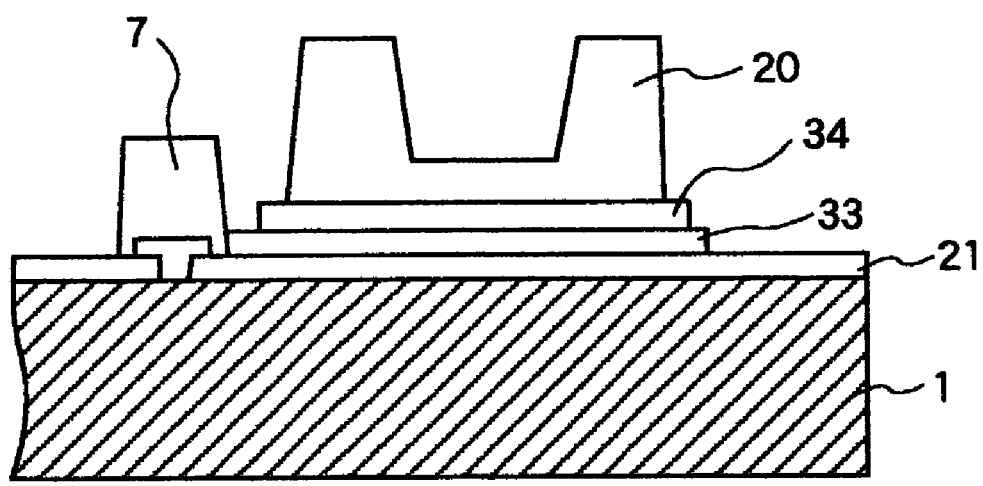
FIG. 16 is a substantial-part schematic cross sectional view of the first substrate of the organic EL panel explaining a sixth embodiment according to this invention.

FIG. 16 is the substantial-part schematic cross sectional view of the first substrate of the organic EL panel explaining the sixth embodiment of the image display apparatus according to this invention. In this embodiment, the metallic light-shield film 34 and the ultraviolet-ray shield resin film 20 formed by printing of the ink were adopted as an ultraviolet-ray shield structure provided on the outer area of the first substrate 1. The cross section of the ultraviolet-ray shield resin film 20 formed by printing of the ink is a recess. Considering the external terminals 21 being on the periphery of the first substrate 1, an insulating layer 33 was interposed between the metallic light-shield film 34 and the external terminals 21. The metallic light-shield film 34 may be anything that can shield the ultraviolet rays. In this embodiment, areas other than the sealing area were covered with a mask, Al was deposited on the areas to a thickness of about 150 nm to prepare the metallic light-shield film 34. Moreover, as the insulating layer 33, a $SiO_2$ film was formed to a thickness of about 100 nm in the predetermined position by a CVD method.

Note that the cross section of the ultraviolet-ray shield resin film 20 is not limited to a recess as described above. By shaping its cross section to concentric double ribs as explained in FIG. 12 through FIG. 15, the same effect as that of the embodiments may be obtained.

Figure 17:
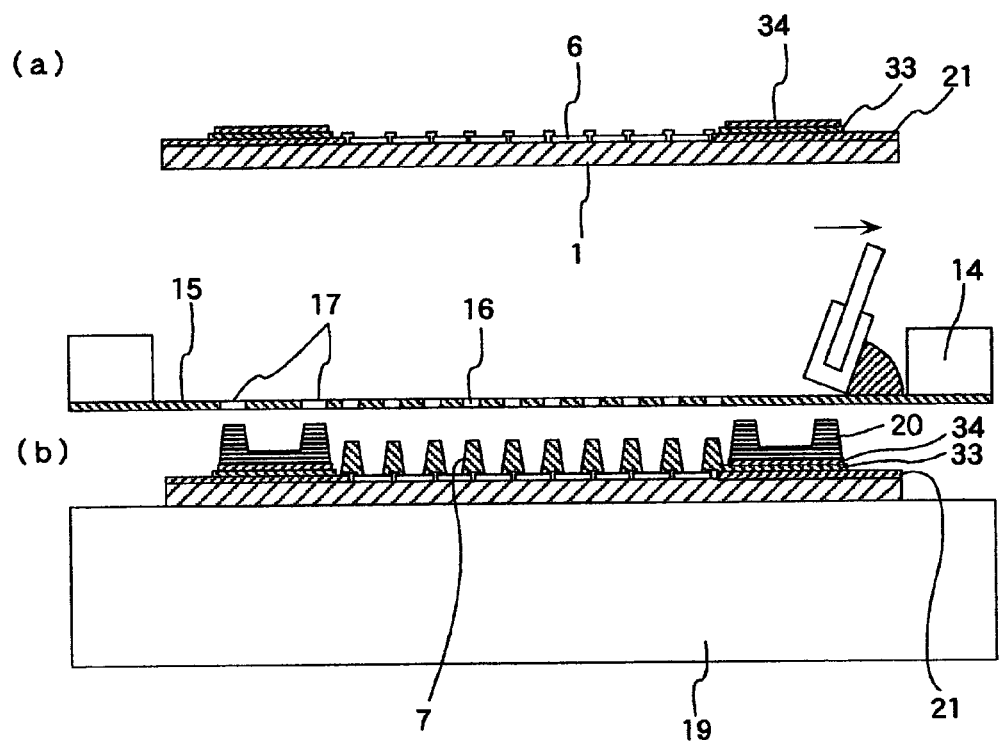
FIG. 17 is an explanatory diagram of a process of forming the pixel separation banks and the ultraviolet-ray shield resin film on the first substrate of the sixth embodiment of this invention shown in FIG. 16.

FIG. 17 is the explanatory diagram of the process of forming the pixel separation banks and the ultraviolet-ray shield resin film on the first substrate of the sixth embodiment of this invention shown in FIG. 16. FIG. 17(A) is a sectional view showing a state in which the metallic light-shield film 34 is formed on the external terminals 21 of the first substrate 1 identical to one shown in FIG. 7(A) with an intermediary of the insulating layer 33. FIG. 17(B) is an explanatory diagram of a process of forming the pixel separation banks and the ultraviolet-ray shield resin film on the first substrate 1 of FIG. 17(A).

The first substrate 1 shown in FIG. 17(A), on whose external terminals 21 the insulating layer 33 and the metallic light-shield film 34 are formed, is placed and fixed on the substrate fixing table 19 of FIG. 17(B). Fixing means is the same as that was explained in FIG. 7. On this, the pixel separation banks 7 and the ultraviolet-ray shield resin film 20 are formed with the screen mask 15 supported by the screen form plate 14. The aperture area of the aperture pattern for transferring ultraviolet-ray shield resin film 17 existing in the screen mask 15 has must be formed surely larger than the aperture area of the aperture pattern for transferring pixel separation banks 16. In order to enlarge the application thickness of the ink for ultraviolet-ray shield resin film thicker than the application thickness of the ink for pixel separation banks and also make it possible to apply both inks simultaneously, the width of the aperture pattern for transferring ultraviolet-ray shield resin film 17 was made larger than the width of the aperture pattern for transferring pixel separation banks 16.

Figure 18:
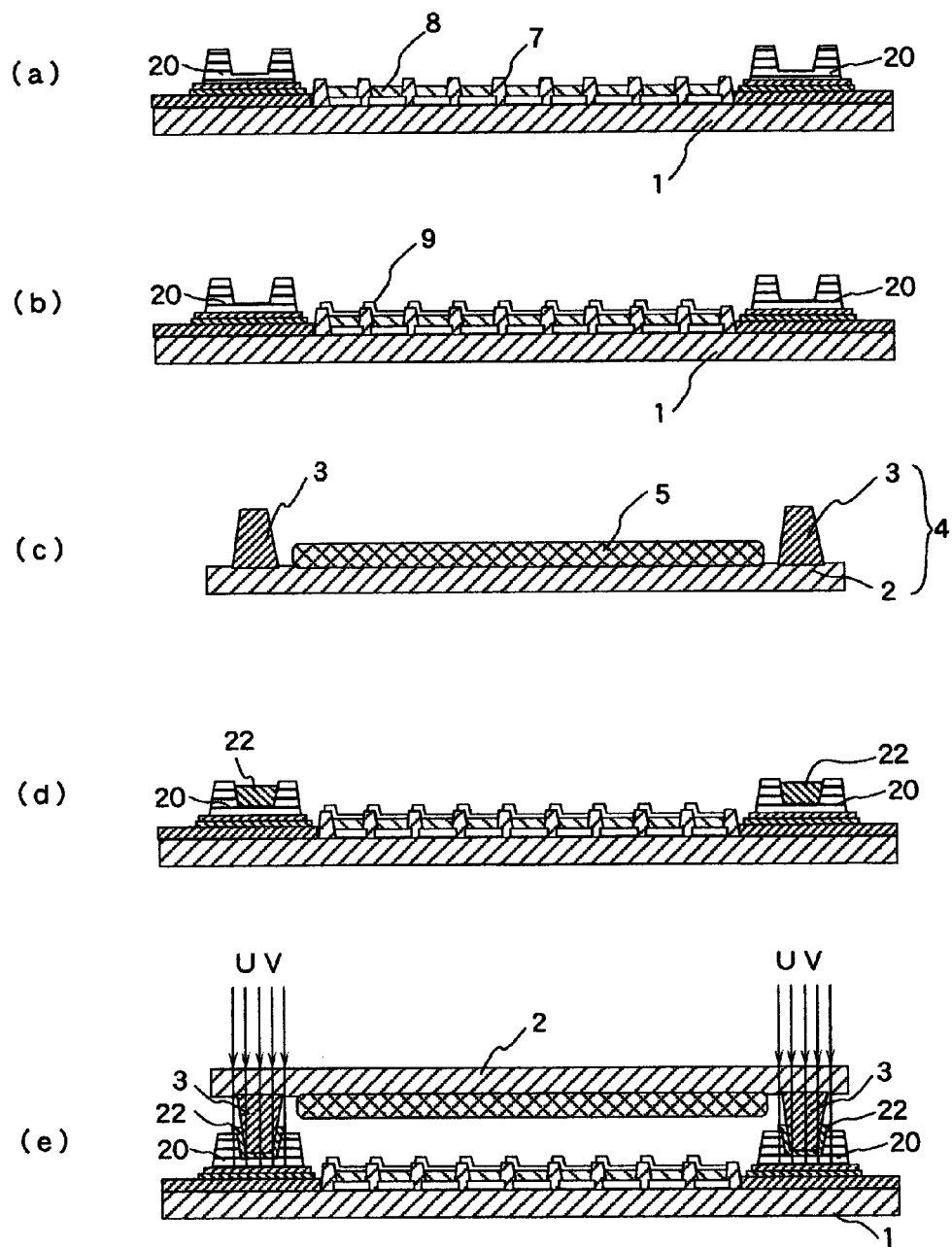
FIG. 18 is a process chart for producing the organic EL panel using the first substrate on which the pixel separation banks and the ultraviolet-ray shield resin film were formed in the process of FIG. 17.

FIG. 18 is the process chart for producing the organic EL panel using the first substrate on which the pixel separation banks and the ultraviolet-ray shield resin film were formed in the process of FIG. 17. As shown in FIG. 18(A), the emitting layer 8 is formed between the neighboring pixel separation banks 7 of the first substrate 1 on which the pixel separation banks 7 and the ultraviolet-ray shield resin film 20 were formed. Next, the cathode electrode 9 is formed on the emitting layer 8 (FIG. 18(B)).

On the other hand, the cap 4 made up of the second substrate 2 having the rib 3 and the adsorbent 5 is prepared (FIG. 18(C)). The sealant 22 is applied to the recess of the ultraviolet-ray shield resin film 20 of the first substrate 1 (FIG. 18(D)), the rib 3 made integral with the second substrate 2 of the cap 4 on its periphery is engaged with the recess of the ultraviolet-ray shield resin film 20 of the first substrate 1, and the sealant 22 interposed in a gap of engagement is cured by irradiating ultraviolet rays UV (FIG. 18(E)).

In this embodiment, since in order to shield the ultraviolet rays, not only the metallic light-shield film 34 but also the ultraviolet-ray shield resin film 20 with a recess-like cross section are formed, shielding of the ultraviolet rays becomes perfect as compared to a case of only with the ultraviolet-ray shield resin film 20. If in stead of the ultraviolet-ray shield resin film 20 in the ultraviolet-ray shield structure of this embodiment using the metallic light-shield film together, a combination of the lower ultraviolet-ray shield resin film and the ultraviolet-ray shield resin film explained in FIG. 12 through FIG. 15 is adopted, excellent results equal to or better than those of this embodiment may be obtained.

In the explanation above, although the construction of this invention is said to protect the constituent members of the organic EL layers formed on the first substrate from ultraviolet rays, in addition to this, it has also an effect of protecting the semiconductor layer constituting active elements, such as thin-film transistors (hereinafter the active element is assumed as a thin film transistor in the explanation), provided in the display area from the ultraviolet rays irradiated for curing the sealant. The image display apparatus equipped with the organic EL panel on which thin-film transistors for selecting individual pixels arranged inside the sealing area are mounted or in which a drive circuit comprising thin-film transistors arranged inside this sealing area is installed is specified to take any one of the constructions of the embodiments, whereby the thin-film transistors may be protected from the ultraviolet rays.

Therefore, this invention may be applied to image display apparatuses that use an active matrix type display panel of liquid crystal panels, plasma panels, and others (not limited to the organic EL panel) to attain the same effect.

Figure 19:
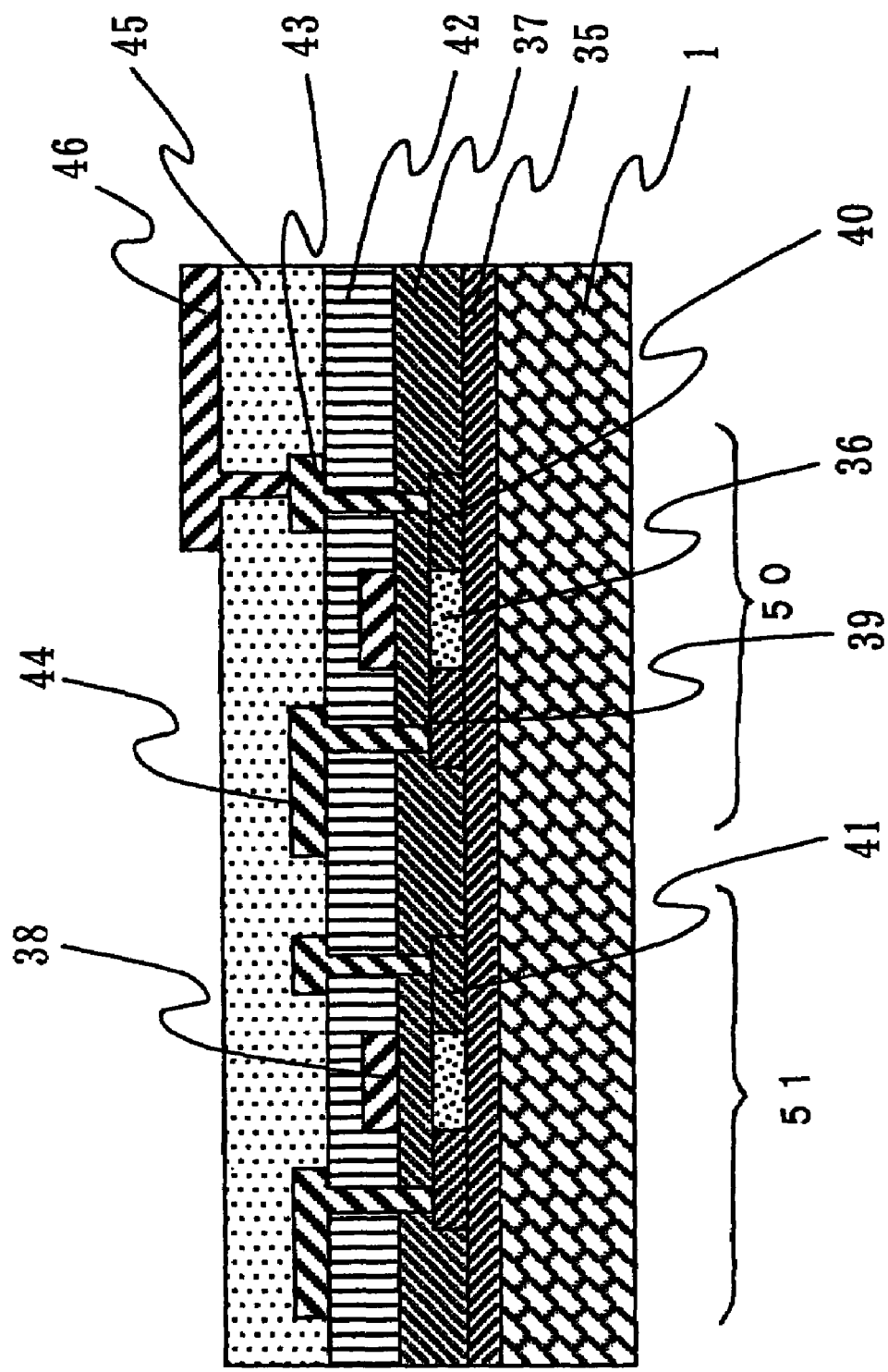
FIG. 19 is a substantial-part schematic cross sectional view for explaining an example of a construction of the thin film transistor formed on the first substrate on which the organic emitting layer is formed.

FIG. 19 is the substantial-part schematic cross sectional view for explaining an example of the construction of the thin film transistor formed on the first substrate on which the organic emitting layer is formed. The thin film transistor is formed from organosilicone nanocluster after undergoing the following steps of: applying organosilicone nanocluster on the first substrate 1 made from a glass plate; forming a silicon oxide ($SiO_2$) film 35 serving as an underlayer by oxidizing this organosilicone nanocluster; forming an island polysilicon film 36 that has a source region, a drain region, and a channel region sandwiched by these regions; forming a gate insulating film 37 on this polysilicon film 36; and forming a gate electrode 38 on the channel region with an intermediary of the gate insulating film 37.

Here, the organosilicone nanocluster means an organic silicon compound soluble to organic solvents whose band gap is 3 eV to 1.2 eV, which is obtained by making silane tetrahalide and an organic halide react in the presence of an alkali metal or alkaline earth metal, and further treating it with hydrofluoric acid. Part of silane tetrahalide may be substituted with silane trihalide or silane dihalide.

The organosilicone nanocluster thus obtained is soluble to general organic solvents, such as hydrocarbon, alcohol, ether, aromatic solvents, and polar solvents. Moreover, by doing a hydrofluoric-acid treatment at the last stage of synthesis, oxygen atoms incorporated in the organosilicone nanocluster from oxygen, water, and a stop agent in the reaction system may be eliminated When a silicon thin film is intended to be obtained, these oxygen atoms give birth to a silicon oxide film and are not desirable. By doing a hydrofluoric-acid treatment, organosilicone nanocluster as a silicon thin-film precursor containing no oxygen atom may be obtained.

A thin film of organosilicone nanocluster may be obtained from a solution prepared by dissolving organosilicone nanocluster in a suitably chosen solvent by the general thin-film forming method that uses a wet process, such as the spin coating method and the dipping method. If the organosilicone nanocluster that was formed into a film is heated or irradiated with ultraviolet rays in a virtually oxygen-free atmosphere or in a reducing atmosphere, a silicon thin film may be obtained; if it is heated or irradiated with ultraviolet rays in an oxidizing atmosphere, a silicon oxide thin film may be obtained. The heating and irradiation of ultraviolet rays may be combined. Moreover, it is also possible to obtain a silicon thin film by laser irradiation on it in a virtually oxygen-free atmosphere or in a reducing atmosphere.

A thin film transistor is formed on the silicon oxide film that is made of this organosilicone nanocluster as a precursor. As described above, organosilicone nanocluster is made of silane tetrahalide as an ingredient, and the silicon oxide film made of organosilicone nanocluster contains halogen. Halogen has an effect of making sodium ion, potassium ion, etc. seclude and capturing them to perform a getter action, and effectively prevents impurities from diffusing into the thin film transistor from the first substrate 1 that is a glass plate. Further, for prevention of impurity diffusion, the thicker the thickness of the silicon oxide film, the larger the effect. A film of organosilicone nanocluster may be formed by spin coating, formation of a large-area thick film is easy, variation in the threshold value caused by impurities may be suppressed, and neither bending nor cracks are generated. Therefore, this invention is extremely useful for production of the image display apparatus using the organic EL panel that uses a large-area glass substrate.

Further, by appropriately combining a process of oxidizing organosilicone nanocluster and a process of converting it to a silicon thin film without oxidizing, an island silicon layer and a silicon oxide film surrounding the island silicon layer may be formed, a structure with a reduced level difference of edges of the island semiconductor layer may be realized, and reduction of the withstand voltage due to a gate insulating film being made a thin film may be prevented. In addition, since this technology can form the island semiconductor layer and the insulating film surrounding it by processing steps whose number is fewer than that of the conventional island semiconductor layer formation method consisting of exposure, development, and etching after formation of a semiconductor layer, it is possible to curtail manufacturing costs.

The thin film transistor according to this embodiment has a construction comprising: the oxide silicon film 35 formed on the first substrate 1 whose surface is nonconductive; a plurality of island polysilicon semiconductor films 36 each of which has a main surface and end faces; a source region, a drain region, and a channel region sandwiched by these regions in this polysilicon semiconductor film 36; a first insulating film (gate insulating film) 37 on the silicon oxide film 35 that contact only with the end faces of the island polysilicon semiconductor film 36, a second insulating film (interlayer insulating film) 42 that covers the island polysilicon semiconductor film 36 and the gate insulating film 37; the gate electrode 38 formed on the channel region with the interlayer insulating film 42 on it; and the source region, the drain region, and a source electrode 43 and a drain electrode 44 that connects with the source region and the drain region, respectively, wherein the oxide silicon film is specified to contain a halogen element.

Since the island polysilicon semiconductor film 36 and the gate insulating film 37 contact with each other only at their end faces, level difference is small and hence the reduction of the withstand voltage of the gate insulating film 37 due to a state of being a thin film may be prevented. Further, since the silicon oxide film contains a halogen element, it can prevent impurity invasion through diffusion into the gate oxide film from the first substrate 1 effectively.

Here, a method for preparing an organosilicone nanocluster solution will be described. As an alkali metal, shaved Mg metal (64 mmol) is put into a round bottom flask and is activated by heating at 120° C. under a vacuum. After being cooled, the reaction system is changed to be in the atmosphere of nitrogen, and dehydrated tetrahydrofuran (THF) is added. Tetrachlorosilane (16 mmol) is added to this and is made to react at 0° C. with irradiation of ultrasonic wave (60 W). After making it react for 2.5 hours, tert-butyl bromide (16 mmol) is made to react with a dark brown reaction liquid so generated. After making it react for 1 hour, the temperature of the reaction liquid is set to 50° C., and it is made to react further for 0.5 hour. This reaction liquid is dropped into distilled water, and insoluble matter is collected by a filtration process. The collected insoluble matter is distributed in 47% hydrofluoric acid, and is made to react for 30 min. with stirring to obtain another insoluble matter. This insoluble matter is solved in toluene, as a solvent, to a solution of 16% by weight to prepare an organosilicone nanocluster solution.

Next, a method for constructing thin film transistors on the first substrate 1 will be described with reference to FIG. 19. The first substrate 1 is an alkali-free glass with a strain point of 670° C., whose size is set to 348 mm×267mm. On this first substrate 1, an organosilicone nanocluster solution is applied using the spin coating method in which rotational frequency is adjusted so that a film thickness becomes 500 nm, and is dried on a hot plate at 80° C. for 1 min. Then, ultraviolet rays are irradiated on the first substrate 1 for 3 min. with a 500 W extra-high pressure mercury lamp in an oxygen atmosphere to obtain a silicon oxide ($SiO_2$) film 35. Further, an amorphous silicone layer is deposited to a thickness of 50 nm by the plasma CVD method. Next, by irradiating XeCl excimer laser, the amorphous silicone layer is crystallized to a polysilicon film.

Next, the polysilicon film is patterned by the publicly known photoetching process to obtain the island polysilicon semiconductor film 36. Then, a $SiO_2$ film that will act as the gate insulating film 37 is deposited by the plasma CVD method to a thickness of 70 nm, and further a Nb film is deposited to a thickness of 250 nm by the sputtering method. The Nb film is patterned by the publicly known photoetching process to form the gate electrode 38.

Next, in order to form an N-channel thin film transistor 50, ions of an element are implanted into the island polysilicon semiconductor film 36 to form a high-resistance N-type polysilicon layer 39. Then, a low-resistance N-type polysilicon layer 40 is formed. On the other hand, in order to form a P-channel thin film transistor 51, ion implantation is used to form a low-resistance P-type polysilicon layer 41. As a sheet resistance value of the high-resistance polysilicon layer, a desirable range thereof is 20 k $\Omega$–100 k $\Omega$, and as a sheet resistance of the low-resistance polysilicon layer, it is 500$\Omega$–10000$\Omega$. Moreover, the interlayer insulating film 42 made of $SiO_2$ is formed to cover the whole structure. On this film, a source electrode 43, a drain electrode 44, and necessary wiring of scan lines (gate lines), data lines (drain lines), etc. that are composed of a three-layered Ti/Al/Ti metal film are formed. Necessary electric contact is established via contact through holes prepared in the interlayer insulating film 42. Here, the three-layered metal film was used to reduce contact resistance between the low-resistance polysilicon layer and the Al layer and contact resistance between the pixel electrode (ITO) 46 and the Al layer.

After patterning of the source electrode 43, the drain electrode 44, and the necessary wiring, a protective insulating film 45 of a thickness of 500 nm and made of $Si_3N_4$ is formed so as to cover the whole structure. Further, via contact though holes prepared in the protective insulating film 45, electric contact between the pixel electrode (ITO) 46 and the source electrode 43 of the N-channel thin film transistor 50 of the image display unit is established.

Oxidization of the silicon nanocluster at the time of formation of an underlayer film (silicon oxide film 35) may be done using the heating method, or using a combination of the ultraviolet-ray irradiation method and the heating method. In this case, the irradiation of ultraviolet rays is effective for improvement of a throughput, and the heating is effective for improvement of film quality, such as densification of the film. Moreover, as the underlayer film, a multilayer film composed of a silicon oxide film and a thin silicon nitride film may be used instead of the oxide silicon film. With the use of the silicon nitride film as a buffer layer, impurities in the glass substrate will be able to be prevented from invading the gate insulating film through diffusion more effectively.

A method for crystallizing amorphous silicon may be a solid-phase growth method by thermal annealing or a combination of thermal annealing and laser annealing. The gate insulating film may be an oxide film of organosilicone nanocluster. Movement of sodium, potassium, etc. is inhibited by a function of a halogen in the film. Further, deposition methods of various insulating films of the interlayer insulating film, the protective film, etc. may be the publicly known deposition methods, such as the plasma CVD method. Further, electrode materials of the gate electrode, the source electrode, and the drain electrode may be publicly known electrode materials, such as Al, Ti, and Ta.

Further, the film is heated at 500° C. for 1 hour under a vacuum condition ($1\times10^{-5}$ torr) before being irradiated by a XeCl excimer laser, this process may be substituted with irradiation of ultraviolet rays in a virtually oxygen-free atmosphere or in a reducing atmosphere, or this process is modified to a combination of the heating and the irradiation with ultraviolet rays. The irradiation of ultraviolet rays is effective for improvement of a throughput, and the heating is effective for improvement of the film quality, such as densification of film. Further, the film may be crystallized by laser irradiation in a virtually oxygen-free atmosphere or in a reducing atmosphere with this process of heating omitted. In this case, since the process is simplified, the manufacturing costs maybe curtailed.

Moreover, an oxidation method for organosilicone nanocluster may be a process of heating in an oxidizing atmosphere. In this case, it is desirable to form the island semiconductor layer before oxidization. Heat treatment of the island semiconductor layer after island film layer formation yields a denser film. As an alternative process for production, a method for covering a portion that will become an island semiconductor layer with a mask, heating it in an oxidizing atmosphere to form the island semiconductor layer and the insulating layer surrounding it simultaneously is effective for simplification of the production process. Further, irradiation with ultraviolet rays or laser light after mask removal improves the film quality of the semiconductor layer.

Since after forming the organosilicone nanocluster by the spin coating method, either an oxide silicon film or a non-single-crystal silicon film is formed, this method is effective for a process using a large-size substrate. Moreover, since the silicon oxide film formed from the organosilicone nanocluster contains a halogen element, deterioration of the thin film transistor characteristics caused by impurities in the glass substrate may be prevented.

Further, since a structure with reduced level difference of the edges of the island semiconductor layer may be realized, the reduction of the withstand voltage due to the gate insulating film being made thin may be prevented. Since this technology can form the island semiconductor layer and the insulating film surrounding by processing steps—exposure and heating, or only exposure, or the like—whose number is fewer than that of the conventional island semiconductor layer formation method consisting of exposure, development, and etching, it is possible to curtail manufacturing costs. Moreover, since the island semiconductor layer and the insulating layer surrounding it contain a halogen element, deterioration of the thin film transistor characteristics caused by impurity invasion through diffusion into the gate insulating layer from the glass substrate may be prevented.

Since the production of the thin film transistor according to this invention described above uses a spin coating method instead of the conventional CVD method, electric power required for film formation may be reduced. Therefore, the method can provide a high-reliability and inexpensive liquid crystal display apparatus. Needless to say, only by modifying the method for producing a non-single-crystal silicon thin film from the conventional CVD method to the spin coating method of this invention, the manufacturing costs may be curtailed and an inexpensive liquid crystal display apparatus may be provided because of several merits, such as capability of forming a uniform film on a large-size substrate and reduction in electric power at the time of film formation.

In the film formation method described above, after forming organosilicone nanocluster by the spin coating method, irradiation of ultraviolet rays in a virtually oxygen-free atmosphere or in a reducing atmosphere may be conducted, or heating in the same atmosphere may be conducted. Further, the both may be combined. The irradiation of ultraviolet rays is effective for improvement of a throughput, and the heating is effective for improvement of the film quality, such as densification of the film. After the irradiation of ultraviolet rays or the heating, if laser irradiation is conducted further, the crystallinity of silicon will be improved and the characteristics of thin film transistor will be improved. Further, laser irradiation may be conducted in a virtually oxygen-free atmosphere or in a reducing atmosphere to make the film crystallize, omitting the irradiation of ultraviolet rays or the heating. In this case, since a process is simplified, the manufacturing costs may be curtailed. The method for producing thin-film transistors in the image display apparatus of this invention is not restricted to the embodiments, but may be the method being used for the conventional liquid crystal panel etc.

In the organic EL panel that has thin-film transistors in the pixel area of the first substrate, the second substrate constituting the cap is aligned to the first substrate and the two substrate are sealed at the sealing area located in the outer area of the first substrate with the sealant. At this time, by providing the ultraviolet-ray shield resin film for shielding ultraviolet rays in the shape of a picture frame on the outer area of the substrate that corresponds to the sealing area, the emitting layered product made up of organic materials may be protected from ultraviolet rays at the time of curing the sealant with ultraviolet light. That is, since when the sealant is cured by ultraviolet rays, by virtue of the ultraviolet-ray shield resin film, the ultraviolet rays are not scattered in the first substrate nor propagate through the first substrate to reach the emitting layered product, deterioration of the characteristics of the emitting layered product may be prevented.

Further, concentric protrusions of the ultraviolet-ray shield resin film that is to be formed simultaneously with the pixel separation banks are formed to the shape of a picture frame, a recess is provided in the central portion of the picture frame, in terms of a running-around direction, that encircles the pixel area, and the rib made integral with the second substrate is made to engage with this recess, whereby alignment of the two substrates becomes easy. That is, the recess of the ultraviolet-ray shield resin film serves as a guiding member for aligning the rib of the second substrate, and hence the two substrates may be superposed easily and with high accuracy. Further, since adoption of this sealing structure can increase the bonding distance of the sealant, more assured airtight sealing is made possible.

Figure 20:
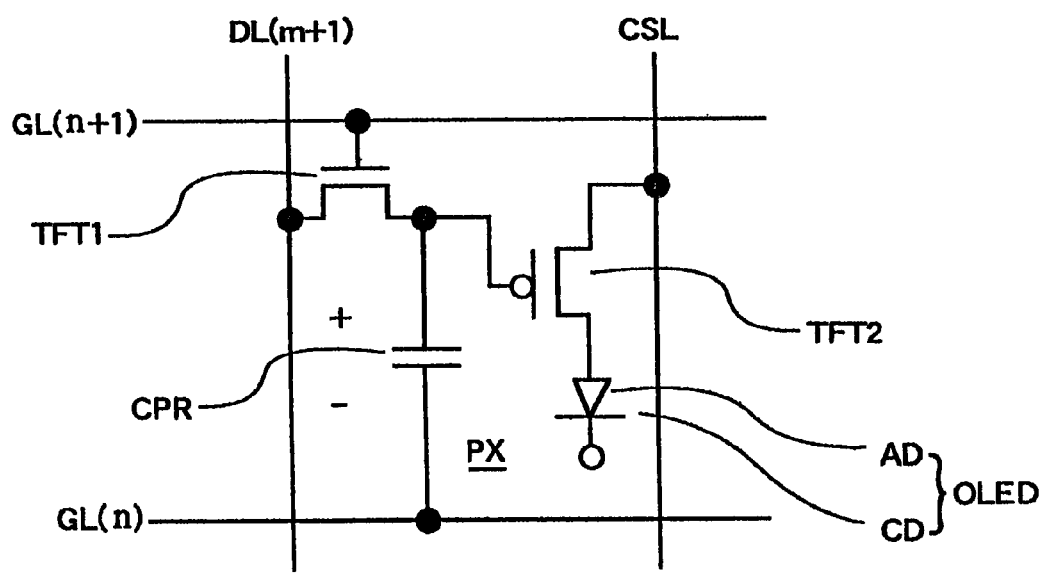
FIG. 20 is a circuit diagram for explaining an example of a construction of one pixel of the organic EL panel.

FIG. 20 is the circuit diagram for explaining an example of the construction of one pixel of the organic EL panel. The one pixel has a thin film transistor explained in FIG. 19. It is formed in an area surrounded by a data line DL(m+1), scan lines GL(n+1), GL(n), and a current-supply line CSL.

Here, explanation will be given assuming that a scan line currently being scanned (selected) is GL(n+1). Attention is paid to a pixel PX among a plurality of pixels selected by the scan line GL(n+1). A first thin film transistor TFT1 acting as an active element is a switching transistor, and a second thin film transistor TFT2 is a driver transistor. A gate of the first thin film transistor TFT1 is connected to the scan line GL(n+1), a drain electrode thereof is connected to the data line DL(m+1), and a source electrode thereof is connected to a gate electrode of the second thin film transistor TFT2.

A drain electrode of the second thin film transistor TFT2 is connected to the current-supply line CSL. Moreover, a source electrode thereof is connected to an anode electrode AD of the organic EL device OLED. One terminal of a capacitor CPR acting as a data signal holding element is connected to a junction point of the source of the first thin film transistor TFT1 and the gate electrode of the second thin film transistor TFT2, and the other terminal thereof is connected to the last scan line GL(n).

The one terminal of the capacitor CPR connected to the junction point of the source electrode of the first thin film transistor TFT1 and the gate electrode of the second thin film transistor TFT2 is a positive (+) electrode, and the other terminal connected to the scan line GL(n) is a negative (−) electrode. Moreover, the organic luminescent device OLED has a construction in which the organic emitting layer is sandwiched between the anode electrode AD and the cathode electrode CD, the anode electrode AD is connected to the source electrode of second thin film transistor TFT2, and the cathode electrode CD is formed as a single electrode for all the pixels.

The data signal that was written in the capacitor and held as the amount of electric charge by the turn-on of the first thin film transistor TFT1 controls a current supplied from the current-supply line CSL by the turn-on of the second thin film transistor TFT2 accompanying the turn on of the first thin film transistor TFT1. A current having the amount of current controlled by the amount of electric charge held at the capacitor CPR (indicating a level in gradation of a data signal) is made to flow in the organic luminescent device OLED. The organic luminescent device OLED emits light at brightness almost proportional to the amount of current supplied and with a color depending on an organic material of the organic luminescent device OLED.

In the case of color display, usually a material of the organic emitting layer is changed for each of pixels of red, green, and blue, or a combination of a white-color organic emitting layer material and color filters of red, green, and blue is used. Incidentally, the data signal may be given either as an analog value or as a digital value of a time division scheme. Moreover, gradation control may be performed by a combination of an area gradation method in which an area of each pixel of red, green, or blue is divided.

Figure 21:
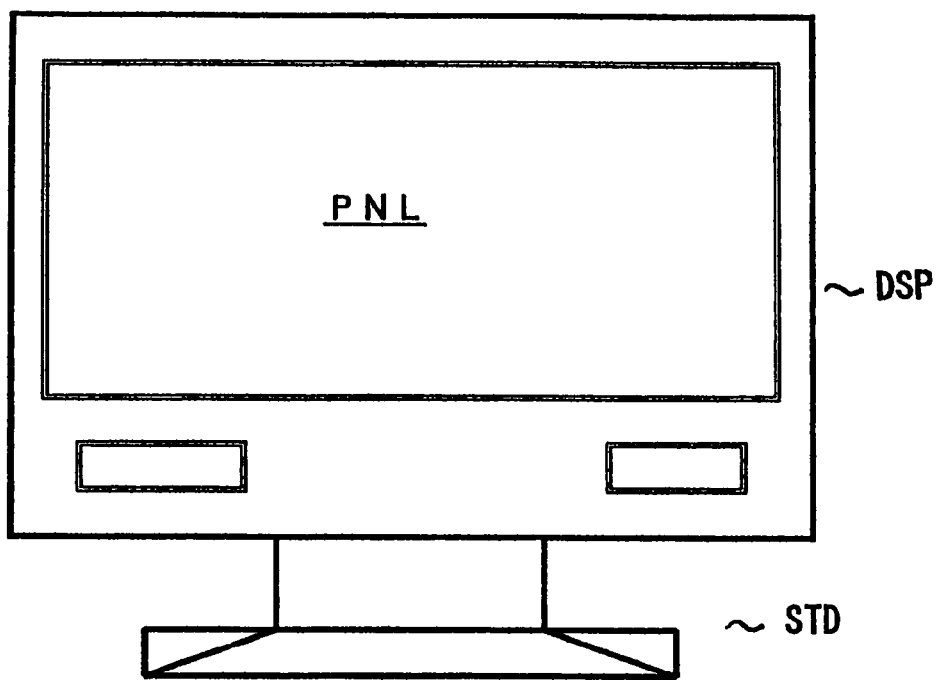
FIG. 21 is an external view of a television receiver as one example of an electronic apparatus equipped with the image display apparatus of this invention.

FIG. 21 is the external view of a television receiver as one example of an electronic apparatus equipped with the image display apparatus of this invention. Reference symbol DSP denotes a display part, and reference symbol STD denotes a stand part. The image display apparatus with one of the constructions of the embodiments is mounted on the display part DSP. Note that the image display apparatus of this invention may be mounted on personal computers and various kinds of monitors.

As described in the foregoing, since in this invention, the recess of the ultraviolet-ray shield resin film formed by concentric protrusions in the shape of a picture frame is provided in the outer area of the first substrate, the rib made integral with the second substrate on its periphery is engaged with this recess, and the two substrates are sealed with an intermediary of the sealant; therefore the emitting layered product composed of the organic material existing in the display area and/or the semiconductor layer constituting the active elements may be prevented from being deteriorated by the ultraviolet rays for curing the sealant. Moreover, since the ultraviolet-ray shield resin film (or the ultraviolet-ray shield resin film and the metallic light-shield film) is formed on the first substrate simultaneously with the pixel separation banks, the second substrate may be bonded to the first substrate 1 without misaligning the rib of the second substrate to the area of the second substrate in which the emitting layered products are formed, so that high-precision sealing and high-reliability airtight sealing with the sealant may be realized.

While we have shown and described several embodiments in accordance with our invention, it should be understood that disclosed embodiments are susceptible of changes and modifications without departing from the scope of the invention. Therefore, we do not intend to be bound by the details shown and described herein but intend to cover all such changes and modifications as fall within the ambit of the appended claims.

We claim:

1. An image display apparatus comprising
    a light-transmitting first substrate that has a display area in which a large number of pixels each having an active element are arranged in a matrix form, and
    a light-transmitting second substrate that is sealed to the first substrate by interposing a sealant on a picture-frame sealing area located in the outer area of the display area, wherein
    the image display apparatus further comprises an ultraviolet-ray shield resin film for shielding ultraviolet rays provided between the first substrate in the sealing part and the sealant.

2. The image display apparatus according to claim 1, further comprising an ultraviolet-ray shield resin film provided in a portion excluding a sealant interposing portion of the second substrate.

3. An image display apparatus comprising
    (a) a light-transmitting first substrate on which a plurality of pixels are arranged in predetermined locations in a matrix form, each pixel composed of an anode electrode driven by an active element, an emitting layered product such that an organic layer having at least an emitting layer is formed on an area encircled by pixel separation banks made of a resin formed on the anode electrodes, and a cathode electrode that sandwiches the emitting layered products between itself and the anode electrodes; and
    (b) a light-transmitting second substrate that is sealed to the first substrate by interposing a sealant on a picture-frame sealing area located in the outer area of the display area, wherein
        the image display apparatus further comprises an ultraviolet-ray shield resin film for shielding ultraviolet rays in the sealing area between the first substrate and the sealant.

4. The image display apparatus according to claim 3, further comprising either an ultraviolet-ray shield resin film or a metallic light-shield film for shielding ultraviolet rays provided in a portion excluding a sealant interposing portion of the second substrate that corresponds to the picture-frame sealing area of the second substrate.

5. The image display apparatus according to claim 3, wherein an adsorbent for adsorbing gases and moisture is provided inside the picture-frame sealing area of the second substrate.

6. The image display apparatus according to claim 3, wherein a forming material of the ultraviolet-ray shield resin film formed on the first substrate has the same properties as the material of the pixel separation banks.

7. The image display apparatus according to claim 3, wherein
    a forming material of the ultraviolet-ray shield resin film has the same properties as the material of the pixel separation banks;
    a cross section vertical to the first substrate lying in a direction crossing the picture-frame sealing area has a recess composed of an inner peripheral protrusion protruding on the display area side and an outer peripheral protrusion protruding on a side opposite to the display area side;
    thicknesses of the inner peripheral protrusion and of the outer peripheral protrusion are larger than the thickness of the pixel separation banks;
    the second substrate has a rib that runs along its periphery and engages with the recess of the ultraviolet-ray shield resin film, and
    the sealant exists between the recess and the rib.

8. The image display apparatus according to claim 3, further comprising a metallic light-shield film for shielding ultraviolet rays provided between the ultraviolet-ray shield resin film and the first substrate.

9. The image display apparatus according to claim 3, wherein the emitting layer is an organic electroluminescence emitting layer.

10. The image display apparatus according to claim 1, wherein the active element is a thin film transistor using a low-temperature polysilicon semiconductor layer.

11. The image display apparatus according to claim 3, wherein the active element is a thin film transistor using a low-temperature polysilicon semiconductor layer.

12. A process for producing an image display apparatus, comprising at least:
    a display area formation step of forming a large number of active elements arranged in a display area of a light-transmitting first substrate in a matrix form, anode electrodes driven by the respective active elements, and electrodes/wiring including external terminals;
    a pixel separation banks/ultraviolet-ray shield resin film formation step of simultaneously forming pixel separation banks for separating the anode electrodes and an ultraviolet-ray shield resin film that is in the shape of a picture frame along the outer area of the display area of the first substrate and has a recess constructed by an inner peripheral protrusion and an outer peripheral protrusion that are formed in a central portion of the picture frame, in terms of a running-around direction;
    an organic emitting layer formation step of forming organic emitting layers on the respective anode electrodes that were separated by the pixel separation banks;
    a cathode formation step of forming a cathode electrode that covers the organic emitting layers;
    an adsorbent bed formation step of forming an adsorbent bed for adsorbing gases and moisture in an area on the light-transmitting second substrate encircled by the protruding rib running around in the shape of a picture frame on the periphery of the second substrate that corresponds to a sealing area having the ultraviolet-ray shield resin film formed on the first substrate;

a sealant application step of applying a sealant to the recess of the ultraviolet-ray shield resin film of the first substrate; and a substrate sealing step of engaging the rib part of the second substrate with the recess of the first substrate and sealing the two substrates with the sealant.

13. The process for producing an image display apparatus according to claim 12, further comprising a metallic light-shield film formation step of forming a metallic light-shield film for shielding ultraviolet rays on the external terminals located in positions where the ultraviolet-ray shield resin film is formed with an intermediary of an insulating film before the separation banks/ultraviolet-ray shield resin film formation step.

14. The process for producing an image display apparatus according to claim 12, wherein the separation banks/ultraviolet-ray shield resin film formation step is a step that uses a printing method in which a screen mask that has an aperture pattern corresponding to the pixel separation banks and an aperture pattern corresponding to the ultraviolet-ray shield resin film is used.

15. The process for producing an image display apparatus according to claim 12, wherein the pixel separation banks and the ultraviolet-ray shield resin film are formed with a resin resist in which ultraviolet-ray absorbing particles are mixed.

* * * * *